United States Patent
Carey et al.

(10) Patent No.: US 7,382,586 B2
(45) Date of Patent: Jun. 3, 2008

(54) MAGNETIC READ SENSOR EMPLOYING OBLIQUE ETCHED UNDERLAYERS FOR INDUCING UNIAXIAL MAGNETIC ANISOTROPY IN A SELF BIASED FREE LAYER

(75) Inventors: Matthew Joseph Carey, San Jose, CA (US); Jeffrey Robinson Childress, San Jose, CA (US); James L. Nix, Gilroy, CA (US); Stefan Maat, San Jose, CA (US); Ian Robson McFadyen, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 343 days.

(21) Appl. No.: 11/177,990

(22) Filed: Jul. 7, 2005

(65) Prior Publication Data
US 2006/0221515 A1 Oct. 5, 2006

Related U.S. Application Data

(63) Continuation-in-part of application No. 11/096,636, filed on Mar. 31, 2005.

(51) Int. Cl.
*G11B 5/39* (2006.01)
(52) U.S. Cl. .................................. 360/324.1
(58) Field of Classification Search ............... 360/300, 360/327.2, 327.21, 327.22, 327.3, 327.31, 360/327.32, 324.11, 324.12, 319, 126, 324.1; 338/32 R
See application file for complete search history.

(56) References Cited

U.S. PATENT DOCUMENTS

| | | | |
|---|---|---|---|
| 3,943,047 A | 3/1976 | Cruzan et al. | 204/192 |
| 4,309,267 A | 1/1982 | Boyd et al. | 204/298 |
| 5,143,794 A | 9/1992 | Suzuki et al. | 428/611 |
| 5,759,682 A | 6/1998 | Ouchi et al. | 428/332 |
| 5,793,279 A * | 8/1998 | Nepela | 338/32 R |
| 5,815,343 A | 9/1998 | Ishikawa et al. | 360/97.01 |
| 6,007,623 A | 12/1999 | Thiele et al. | 117/95 |
| 6,086,974 A | 7/2000 | Thiele et al. | 428/65.3 |

(Continued)

OTHER PUBLICATIONS

D. Sekiba, R. Moroni, G. Gonella, F. Buatier de Mongeot, C. Boragno, L. Mattera, and U. Valbusa, "Uniaxial magnetic anisotropy tuned by nanoscale ripple formation: Ion-sculpting of Co/Cu(001) thin films," Applied Physics Letters, vol. 84 No. 5, Feb. 2004.

(Continued)

*Primary Examiner*—Tianjie Chen
(74) *Attorney, Agent, or Firm*—Zilka-Kotab, PC

(57) ABSTRACT

A magnetoresistive sensor having a self biased free layer. The free layer is constructed upon an underlayer that has been treated by a surface texturing process that configures the underlayer with an anisotropic roughness that induces a magnetic anisotropy in the free layer. The treated layer underlying the free layer can be a spacer layer sandwiched between the free layer and pinned layer or can be a separate underlayer formed opposite the spacer layer. Alternatively, the texturing of an underlayer can be used to induce a magnetic anisotropy in a bias layer that is separated from the free layer by an orthogonal coupling layer. This self biasing of the free layer induced by texturing can also be used in conjunction with biasing from a hard-bias structure.

41 Claims, 18 Drawing Sheets

U.S. PATENT DOCUMENTS

| | | | |
|---|---|---|---|
| 6,169,303 | B1 | 1/2001 | Anthony ................... 257/295 |
| 6,331,364 | B1 | 12/2001 | Baglin et al. ............ 428/694 T |
| 6,633,466 | B2 * | 10/2003 | Sakaguci et al. ...... 360/327.31 |
| 6,735,850 | B1 | 5/2004 | Gibbons et al. ......... 29/603.07 |
| 6,743,529 | B2 | 6/2004 | Saito et al. ........... 428/694 SG |
| 7,035,061 | B2 * | 4/2006 | Singleton et al. ...... 360/324.12 |
| 7,190,558 | B2 * | 3/2007 | Iwasaki et al. ........ 360/324.11 |
| 2002/0051328 | A1 | 5/2002 | Hasegawa ................... 360/322 |
| 2005/0270702 | A1 * | 12/2005 | Komagaki et al. .......... 360/319 |
| 2007/0139820 | A1 * | 6/2007 | Carey et al. ................ 360/126 |
| 2007/0139826 | A1 * | 6/2007 | Carey et al. ................ 360/319 |

OTHER PUBLICATIONS

Dr. Chen Yunjie, "Highly Oriented Media for High Density Magnetic Recording," Storage Unlimited, Jul.-Sep. 2004.

S. Rusponi, G. Costantini, F. Buatier de Mongeot, C. Boragno, and U. Valbusa, "Patterning a surface on the nanometric scale by ion sputtering," Applied Physics Letters, vol. 75 No. 21, Nov. 1999.

J.E. Lee, Y. Roh, S.C. Oh, H.-J. Kim, Y.K. Ha, J.S. Bae, I.G. Baek, S.O. Park, U.-I. Chung, and J.T. Moon, "Improved Magnetic Tunnel Junction With Amorphous Seed Layer, Surface Treatment, and High-Polarization Magnetic Materials," IEEE Transactions on Magnetics, vol. 40, No. 4, Jul. 2004.

Jan-Ulrich Thiele, M.E. Best, M.F. Toney, D. Weller, "Grain Size Control in FePt Thin Films by Ar-Ion Etched Pt Seed Layers," IEEE Transactions on Magnetics, vol. 37, No. 4, Jul. 2001.

M. Takahashi, H. Shoji, D. D. Djayaprawira, and S. Yoshimura, "Novel Sputtering Process to Reduce the Grain Size and its Distribution in Co-Based Longitudinal Thin Film Media—New Seedlayer and High $K_u^{Grain}$ Material," IEEE Transactions on Magnetics, vol. 36, No. 5, Sep. 2000.

T.C. Arnoldussen, E.M. Rossi, A. Ting, A. Brunsch, J. Schneider, and G. Trippel, "Obliquely Evaporated Iron-Cobalt and Iron-Cobalt-Chromium Thin Film Recording Media," IEEE Transactions on Magnetics, vol. 20, No. 5, Sep. 1984.

M.J. Hadley and R.J. Pollard, "Magnetic and Structural Properties of Co Films Deposited onto Obliquely Sputtered Pt Underlayers," Journal of Applied Physics, vol. 92, No. 12, Dec. 2002.

J.F. Whitacre, Z.U. Rek, J.C. Billello and S.M. Yalisove, "Surface Roughness and In-Plane Texturing in Sputtered Thin Films," Journal of Applied Physics, vol. 84, No. 3, Aug. 1998.

R. Moroni, D. Sekiba, F. Buatier de Mongeot, G. Gonella, C. Boragno, L. Mattera, and U. Valbusa, "Uniaxial Magnetic Anisotropy in Nanostructured Co/Cu(001): From Surface Ripples To Nanowires," Physical Review Letters, vol. 91, No. 16, Oct. 2003.

* cited by examiner

MAGNETIC READ SENSOR EMPLOYING OBLIQUE ETCHED UNDERLAYERS FOR INDUCING UNIAXIAL MAGNETIC ANISOTROPY IN A SELF BIASED FREE LAYER

The present invention is related to patent application Ser. No. 11/097,638 filed on Mar. 31, 2005 entitled MAGNETIC READ SENSOR EMPLOYING OBLIQUE ETCHED UNDERLAYERS FOR INDUCING UNIAXIAL MAGNETIC ANISOTROPY IN A HARD MAGNETIC IN-STACK BIAS LAYER.

The present invention is related to patent application Ser. No. 11/097,920 filed on Mar. 31, 2005 entitled MAGNETIC READ SENSOR EMPLOYING OBLIQUE ETCHED UNDERLAYERS FOR INDUCING UNIAXIAL MAGNETIC ANISOTROPY IN A HARD MAGNETIC PINNING LAYER.

The present invention is related to patent application Ser. No. 11/097,543 filed on Mar. 31, 2005 entitled METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN A HARD MAGNETIC IN-STACK BIAS LAYER.

The present invention is related to patent application Ser. No. 11/097,546 filed on Mar. 31, 2005 entitled A METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN A HARD MAGNETIC PINNING LAYER.

The present invention is related to patent application Ser. No. 11/097,846 filed on Mar. 31, 2005 entitled A METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS.

The present invention is a Continuation In Part of patent application Ser. No. 11/096,636 filed on Mar. 31, 2005 entitled MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS.

FIELD OF THE INVENTION

The present invention relates to magnetoresistive field sensors and more particularly to a sensor having a self biased free layer having a uniaxial anisotropy induced by oblique etching of an underlayer.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of nanometers. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

In a typical design the write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer, both of which can be made up by a plurality of layers. First and second leads are connected to the spin valve sensor for conducting a sense current therethrough. The magnetization of the pinned layer is pinned substantially perpendicular to the air bearing surface (ABS) and is relatively insensitive to applied magnetic fields. The magnetic moment of the free layer is biased parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. Since $\theta$ is near 90 degrees at zero field, the resistance of the spin valve sensor (for small rotations of the free layer from 90 degrees) changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP pinned spin valve includes first and second magnetic layers separated by a thin nonmagnetic coupling layer such as Ru or Ir. The thickness of the coupling layer is chosen so as to antiparallel couple the magnetic moments of the ferromagnetic layers of the pinned layer. A spin valve is also known as a top or bottom spin valve depending upon whether the pinning layer is at the top (formed after the free layer) or at the bottom (before the free layer).

Magnetization of the pinned layer is usually fixed by exchange coupling one of the ferromagnetic layers (AP1)

with a layer of antiferromagnetic material such as PtMn. While an antiferromagnetic (AFM) material such as PtMn does not in and of itself have a net magnetic moment, when exchange coupled with a magnetic material, it can strongly pin the magnetization of the ferromagnetic layer.

A current in plane (CIP) spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

The ever increasing demand for greater data rate and recording density has lead a push to develop current perpendicular to the plane (CPP) sensors which are uniquely suited to use in such systems. CPP sensors include both CPP giant magneto-resistive (GMR) sensors, which use an electrically conductive spacer layer such as Cu as well as tunnel magneto-resistive (TMR) sensors, which use a thin, electrically insulating barrier layer like Al-oxide. The CPP GMR sensor operates based on spin-dependent bulk and interface scattering of the electrons while the TMR sensor operates based on the spin dependent tunneling of electrons through the barrier layer.

In order to stabilize the free layer in CIP GMR, CPP GMR, or CPP TMR sensors against fluctuations due to thermal agitation and to prevent it from breaking up into domains it needs to be biased. One form of biasing a sensor is by using a hard magnetic biasing layer, typically a $Co_{1-x}Pt_x$ or $Co_{1-x-y}Pt_xCr_y$ alloy (x being between 10 and 35 atomic % and y between 0 and 15 atomic %) deposited onto a suitable underlayer material on both sides and about the same level as the free layer. Typically the hard magnetic bias layers also comprise a seed layer of Cr or CrX (X=Mo,Ti,V) on which the magnetic $Co_{1-x}Pt_x$ or $Co_{1-x-y}Pt_xCr_y$ material is deposited to achieve crystalline texture and sufficiently high coercivity. An insulating gap separates the free and the hard biasing layers in CPP sensors to prevent electrical shunting. The hard magnetic bias layer has sufficiently high coercivity and remanence so that its remanent moment magnetostatically biases the free layer in a direction substantially parallel to the ABS. The total moment of the hard bias layer is typically several times the magnetic moment of the free layer. The actual moment value depends on the hard bias material, its shape and separation from the free layer.

Another approach to biasing the free layer is in-stack biasing where an in-stack bias layer is separated from the free layer by a non-magnetic spacer layer. The free layer is stabilized magnetostatically by flux closure and is generally antiparallel to the biasing layer. The biasing layer is typically exchange biased to an antiferronmagnet to pin its moment in a desired direction parallel to the medium facing surface. Alternatively, the bias layer moment can be pinned by using a hard magnet. Yet another approach to biasing the free layer is to insert an orthogonal coupling layer between the free layer and the bias layer. The orthogonal coupling layer is a material that magnetically couples the free and the bias layer in substantially orthogonal directions. The biasing layer is typically exchange biased to an antiferronmagnet to pin its moment in a desired direction perpendicular to the medium facing surface.

One major problem with stabilizing the free layer by external sources such as hard-biasing, in-stack biasing, or biasing with a orthogonal coupling layer is that they increase the complexity of the device. Hard biasing and in-stack biasing rely on magnetostatic coupling with the free layer, which is difficult to control for small sensor sizes. In-stack biasing and biasing with an orthogonal coupling layer increase the sensor stack-height which make these approaches less suitable as gap sizes are reduced for higher recording densities.

Therefore, there is a strong felt need for a mechanism to generate a uniaxial magnetic anisotropy in the free layer which may either be sufficient to self bias the free layer in a direction substantially parallel to the medium facing surface of the sensor or to augment biasing from external sources such as hard biasing or in-stack biasing. As used herein substantially parallel means that the easy axis is closer to parallel than perpendicular to the ABS.

SUMMARY OF THE INVENTION

The present invention provides a magnetoresistive sensor having a self biased free layer. The free layer is deposited over an underlayer that has an anisotropic roughness that induces a magnetic anisotropy in the free layer. The underlayer can be a non-magnetic spacer layer disposed between the pinned layer and free layer or can also be a separate underlayer formed beneath a free layer that is disposed beneath the pinned layer.

The anisotropic roughness can be formed by ion beam etching the spacer or underlayer at an oblique angle with respect to its surface without rotating the substrate. The anisotropic roughness induces a strong magnetic uniaxial anisotropy in the subsequently deposited free layer. The etch angle and direction and energy is chosen such that the induced anisotropy in the subsequently deposited free layer is in a direction substantially parallel to the ABS. The anisotropic roughness can be in the form of ripples or facets which can be oriented depending on material and etch conditions in a direction substantially perpendicular or parallel to the ABS. The spacer is typically comprised of Cu or a Cu alloy. The underlayer may comprise Pt, Ta, PtMn, Cr, Ru, W, Mo, Cu, their alloys, or other preferably crystalline materials.

Alternatively, the textured underlayer can produce a magnetic anisotropy in a bias layer formed thereover. The bias layer can be separated from the free layer by an orthogonal coupling layer that biases the magnetic moment of the free layer in a direction substantially perpendicular to the moment of the bias layer.

The present invention may also provide an additional hard bias layer structure extending laterally from the sides of the sensor stack to augment the self biasing effect induced in the free layer. The hard bias layer magnetic easy axis (magnetic anisotropy) is oriented in a specific direction substantially parallel with the ABS.

The hard bias layer may be constructed over an underlayer that may comprise Pt, Ta, PtMn, Cr, Ru, W, Mo, Cu, their alloys, or other preferably crystalline materials. The hard bias layer deposited thereover may be, for example, CoPt, CoPtCr, typically on a seed layer of Cr or a Cr-alloy, or some other hard magnetic material on a suitable seed layer. The anisotropic roughness is in form of oriented ripples or facets formed by this ion etch which induces a strong magnetic uniaxial anisotropy in the subsequently deposited hard magnetic biasing layers in a direction substantially parallel to the ABS.

The strong magnetic uniaxial anisotropy of the free layer produced by the present invention ensures sufficient magnetic biasing of the free layer even at the extremely small sensor sizes of present and future generation sensors. More-over, the magnetic anisotropy also prevents loss of free layer biasing during high temperature events such as from a head-disk contact.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
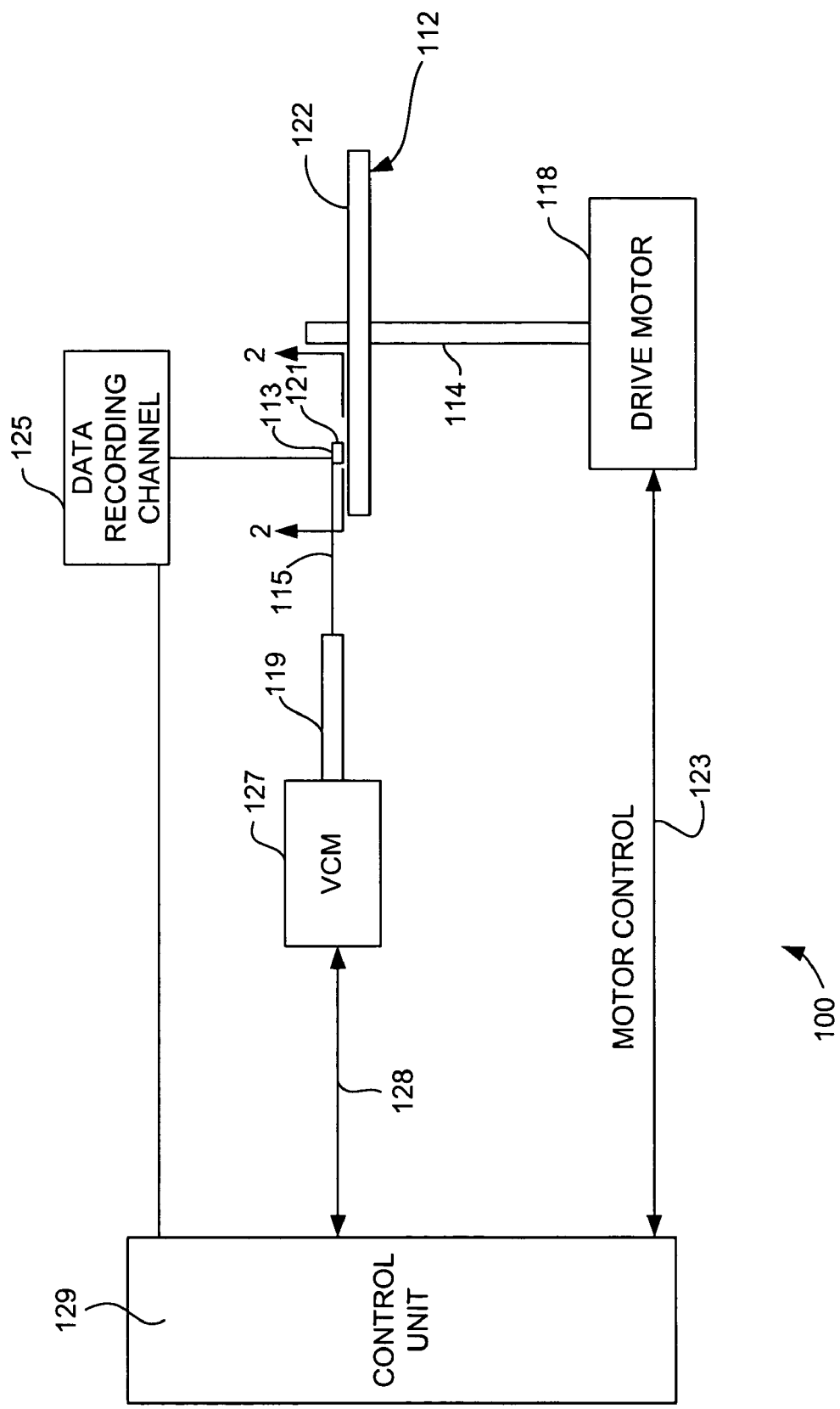
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
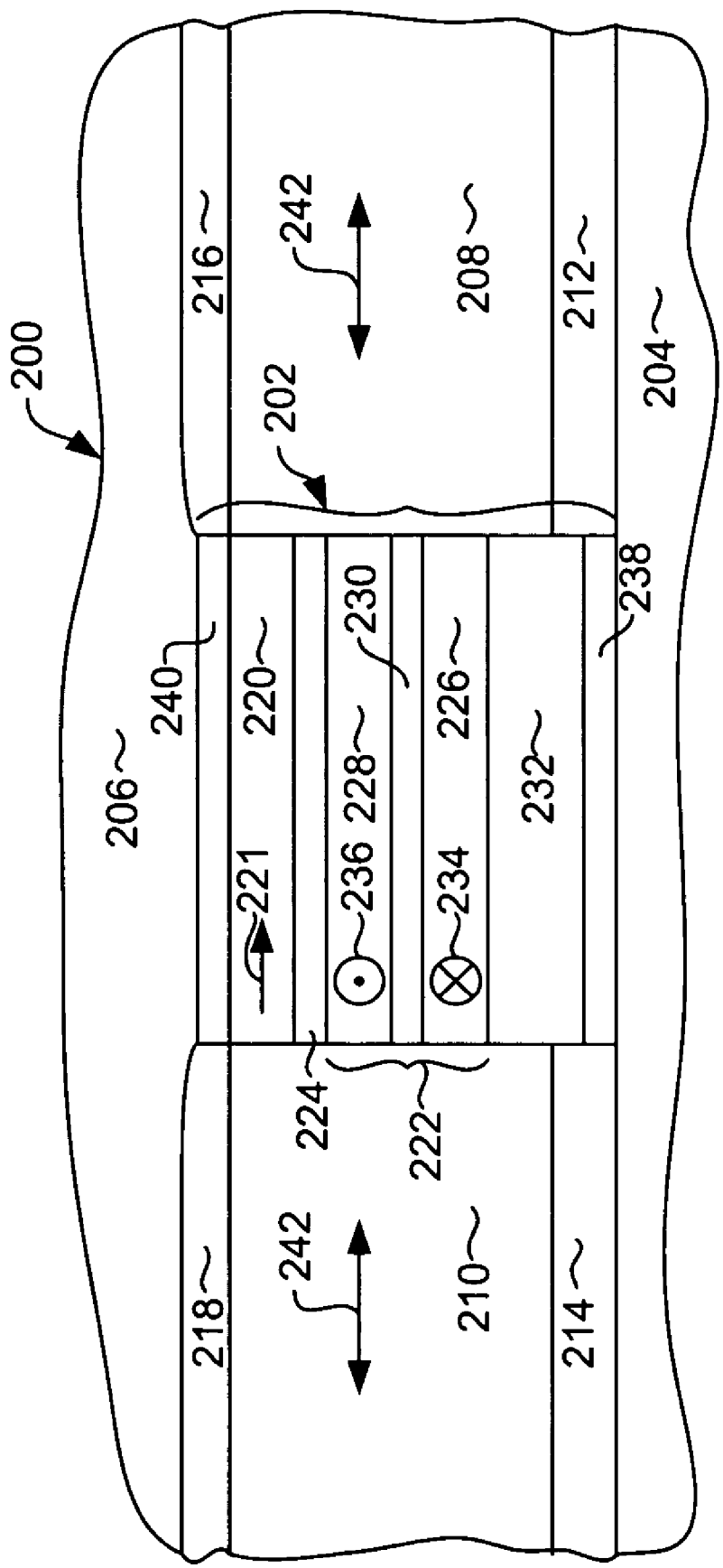
FIG. 2, is an ABS view of a CIP sensor according to a first embodiment of the invention.

With reference now to FIG. 2, a CIP GMR sensor 200 having hard bias layers manufactured according to the present invention is described. The sensor 200 includes a sensor stack 202 sandwiched between first and second non-magnetic, electrically insulating gap layers 204, 206. The first and second hard bias layers 208, 210 extend laterally from the sides of the sensor stack 202. The hard bias layers are deposited over underlayers 212, 214 which will be described in greater detail herein below. First and second leads 216, 218 are deposited over the hard bias layers 208, 210, and may be constructed of for example Au, Rh or some other electrically conductive material.

With continued reference to FIG. 2, the sensor stack 202 includes a magnetic free layer 220, a magnetic pinned layer structure 222 and a spacer layer 224 sandwiched between the free and pinned layers 220, 222. The free layer 220 has a magnetic moment 221 that is biased in a direction parallel with the ABS, but that is free to rotate in response to a magnetic field. The pinned layer may be of various configurations, such as simple, AP coupled, antiferromagnetically (AFM) pinned or self pinned. The free layer 220 can be constructed of one or more layers of for example NiFe, Co, CoFe or other sufficiently soft magnetic material, preferably with a layer of Co or CoFe adjacent to the spacer layer 224. The spacer layer 224 can be constructed of a non-magnetic, electrically conductive material such as Cu.

The pinned layer 222 is preferably an AP coupled pinned layer having first and second magnetic layers AP1 226 and AP2 228 which are antiparallel coupled across an AP coupling layer 230. The AP1 and AP2 layers can be for example CoFe or some other suitable magnetic material. The coupling layer 230 can be constructed of, for example, Ru or Ir and is constructed of a thickness chosen to strongly antiparallel couple the magnetic moments 234 and 236 of the AP1 and AP2 layers, respectively. The coupling layer 230 can be for example 2-10 Angstroms thick or about 8 Angstroms thick. The AP1 layer 226 is exchange coupled with a layer of antiferromagnetic material (AFM layer 232) which strongly pins the magnetic moment 234 of the AP1 layer 226 in a desired direction perpendicular to the ABS and due to AP coupling of the AP1 and AP2 layers 226 and 228 pins the moment 236 of the AP2 layer 228 in a desired direction perpendicular to the ABS, but antiparallel with the moment 234 of the AP1 layer 226.

A seed layer 238 may be provided at the bottom of the sensor stack 202 to promote a desired grain structure on the subsequently deposited sensor layers. In addition, a capping layer 240, such as Ta, may be provided to protect the layers of the sensor stack 202 from damage during manufacture.

With reference still to FIG. 2, the hard magnetic bias layers 208, 210 are constructed of a magnetic material having a high coercivity of 1.5 kOe or higher, preferably $Co_{1-x}Pt_x$ or $Co_{1-x-y}Pt_xCr_y$ (x being between 10 and 35 atomic % and y between 0 and 15 atomic %). Typically the hard magnetic bias layers also comprise a seed layer of Cr or CrX (X=Mo,Ti,V) on which the magnetic $Co_{1-x}Pt_x$ or $Co_{1-x-y}Pt_xCr_y$ material is deposited to achieve crystalline texture and sufficiently high coercivity. The magnetic hard bias layers have magnetic moments that are set substantially parallel to the ABS in order to bias the moment 221 of the free layer in a desired direction substantially parallel with the ABS. The bias layers 208, 210 are formed on underlayers 212, 214. The underlayers 212, 214 can be for example Pt, Ta, PtMn, Cr, Ru, W, Mo, Cu, their alloys, or other suitable, preferably crystalline material and have been treated as described with reference to FIGS. 4A-4D in order to create anisotropic roughness on the surface of the underlayers 212, 214 and to induce a magnetic anisotropy axis 242 in the bias layers 208 and 210 in a direction substantially parallel with the ABS. This means that the underlayers 212, 214 have been ion beam etched prior to deposition of the hard magnetic bias layers 208, 210 at an angle and direction that must be chosen such that the resulting magnetic easy axis of the hard magnetic bias layers 208, 210 is substantially parallel to the ABS.

The underlayers 212, 214 (which may have a thickness of 30-300 Angstroms after etching) exhibit anisotropic roughness for example in the form of oriented ripples or facets in their upper interfaces that may run along a direction oriented substantially parallel or perpendicular to the ABS. The upper surface of the underlayer may have been oxidized prior to deposition of the hard magnetic bias layer.

Figure 5A:
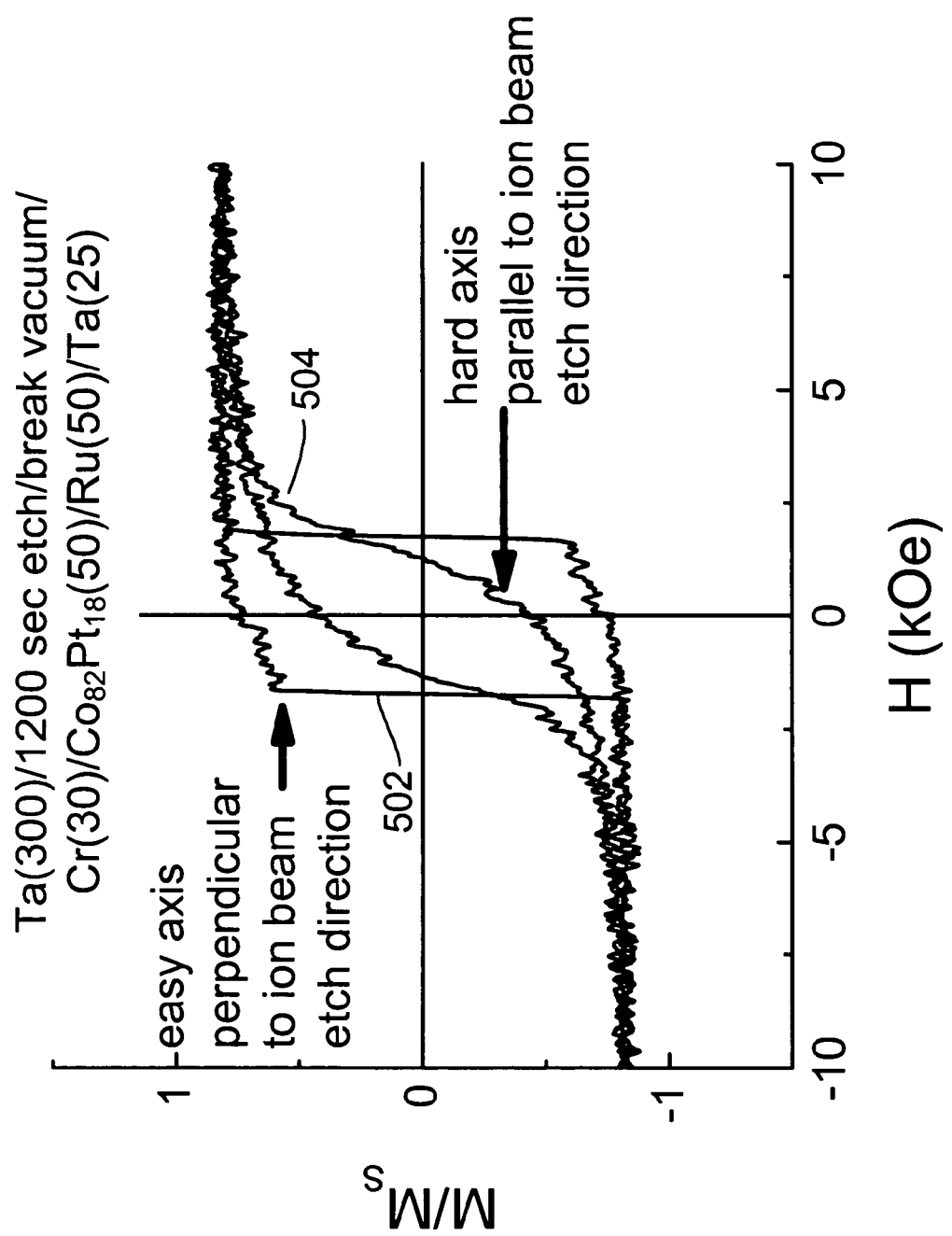
FIG. 5A. is a graph illustrating magnetic hysteresis loops of a Cr(30)/Co$_{82}$Pt$_{18}$(50) film grown onto a Ta underlayer, which was etched for 1200 seconds under an oblique angle of ~45 degrees from normal without rotating the substrate. The hysteresis loops are measured perpendicular and parallel to the ion-beam direction.

FIG. 5A shows magnetic hysteresis loops of hard bias layer 208, 210 formed over an underlayer 212, 214 treated as described above. The lines 502 show the hysteresis loop in response to a magnetic field parallel with the easy axis of the hard bias layer 208, 210. The lines 504 show the hysteresis loops in response to a magnetic field that is perpendicular to the easy axis of the hard bias layers 208, 210. The strong anisotropy 242 of the hard magnetic bias layers 208, 210 greatly facilitates effective biasing of the free layer 220. As sensors become smaller, effective stable biasing becomes increasingly difficult. The strong anisotropy 242 provided by the present invention, therefore, greatly facilitates stable free layer biasing in a very small magnetoresistive sensor.

Figure 3A:
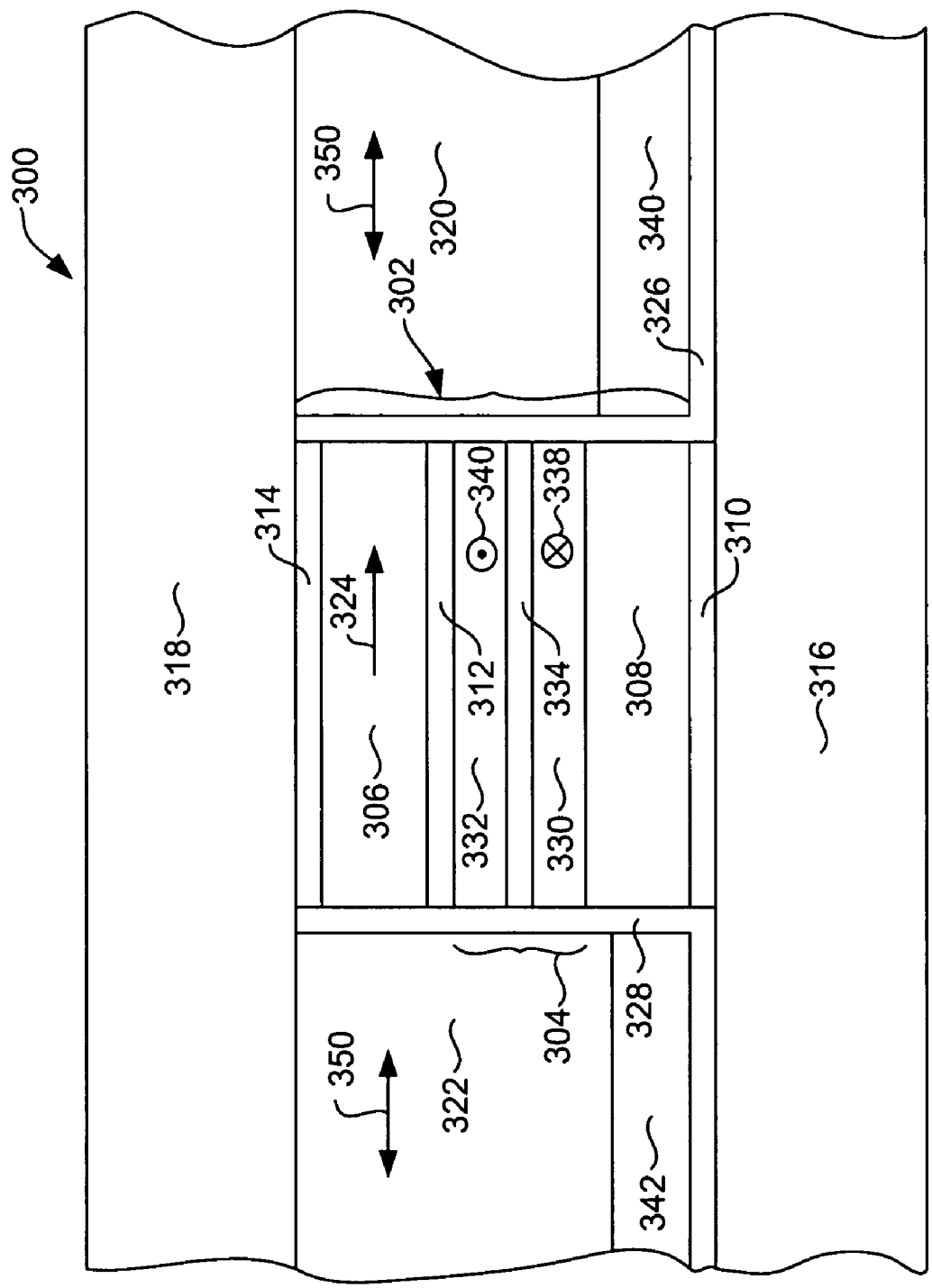
FIG. 3A is an ABS view of a CPP sensor according to a second embodiment of the invention.
Figure 3B:
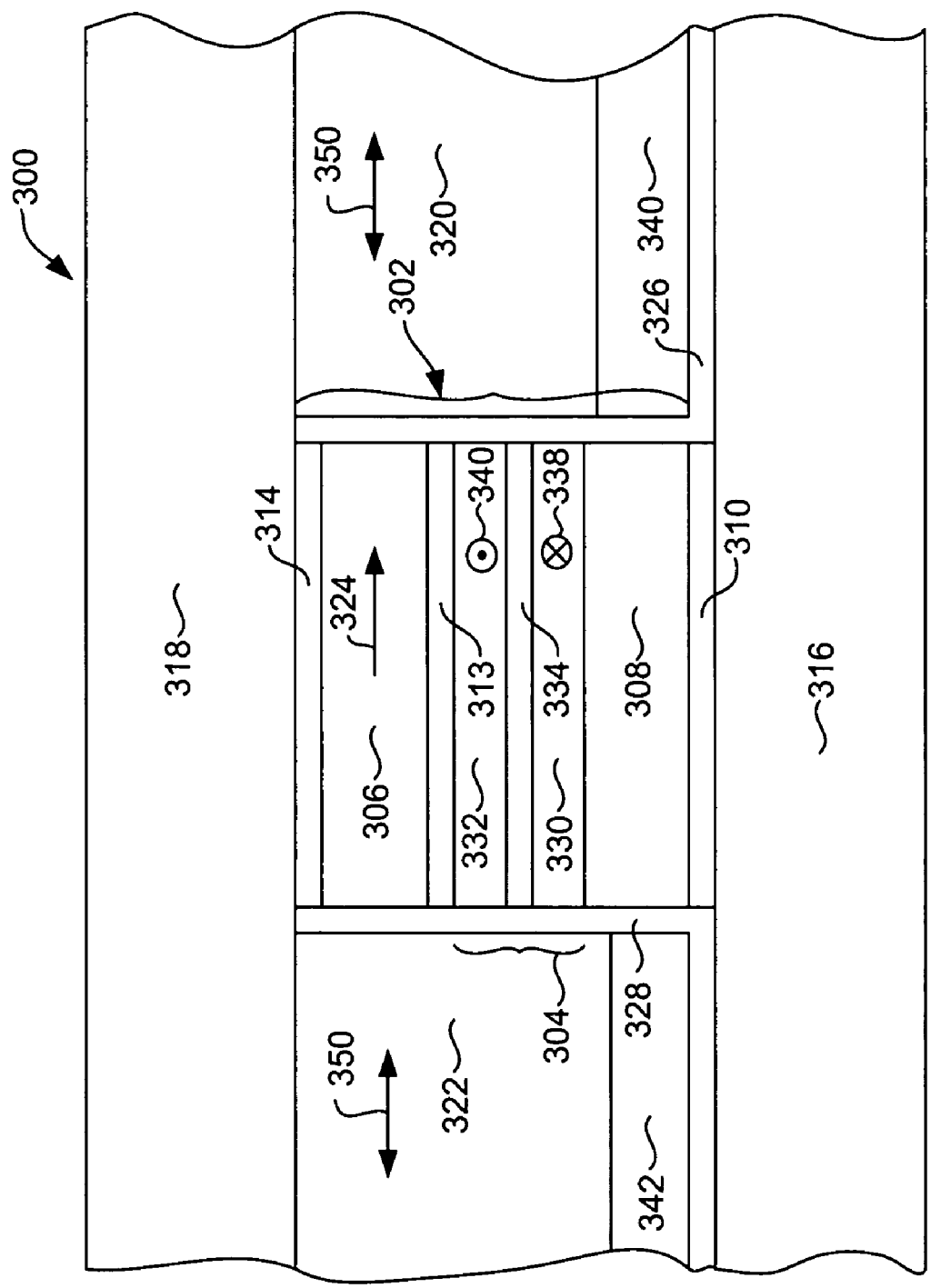
FIG. 3B is an ABS view of a CPP sensor according to another embodiment of the invention.
Figure 4A:
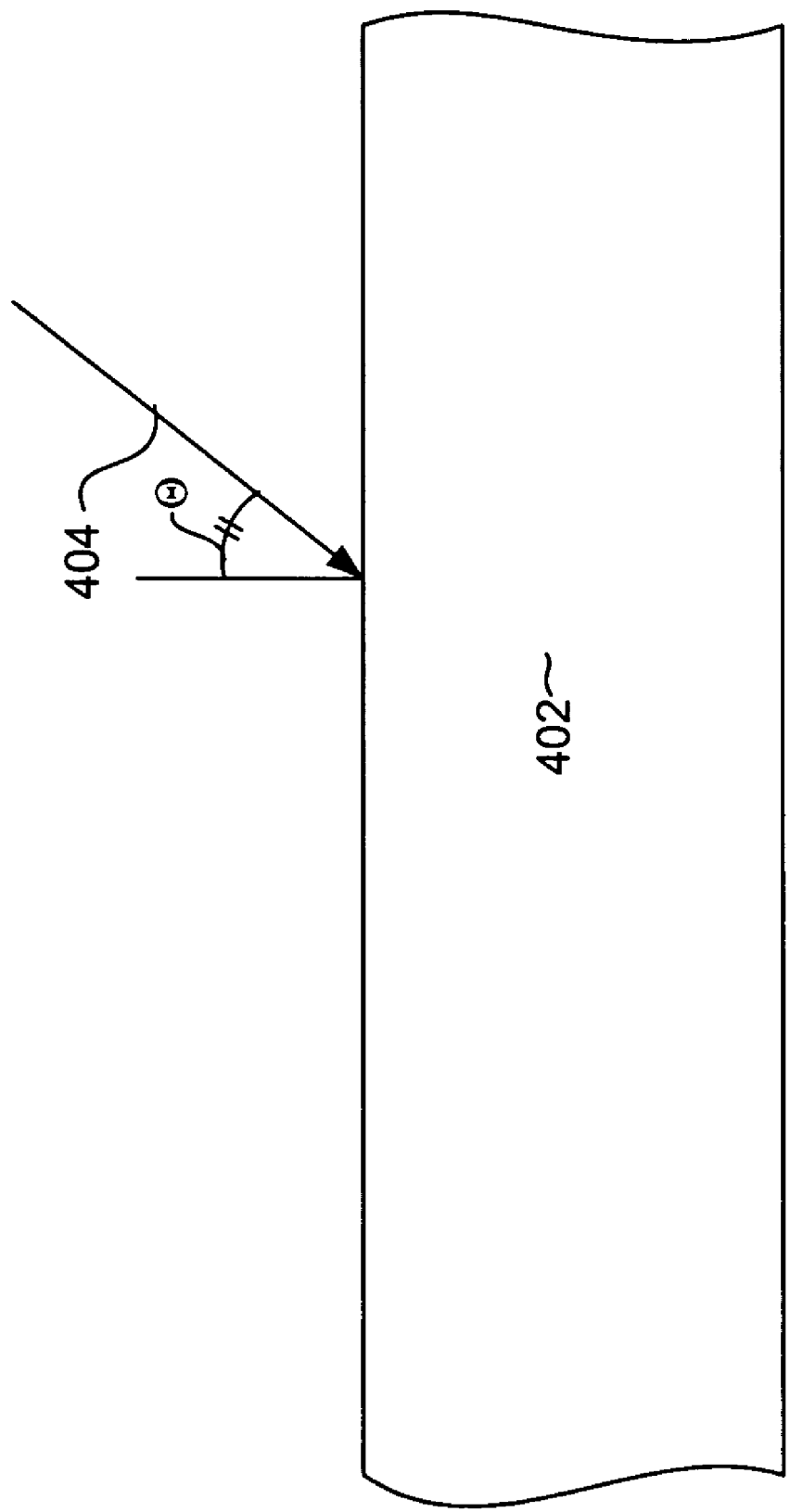
FIGS. 4A through 4D are cross sectional (4A, 4C, 4D) and isometric (4B) views illustrating a method of setting magnetic anisotropy in a magnetic layer according to the present invention.
Figure 4B:
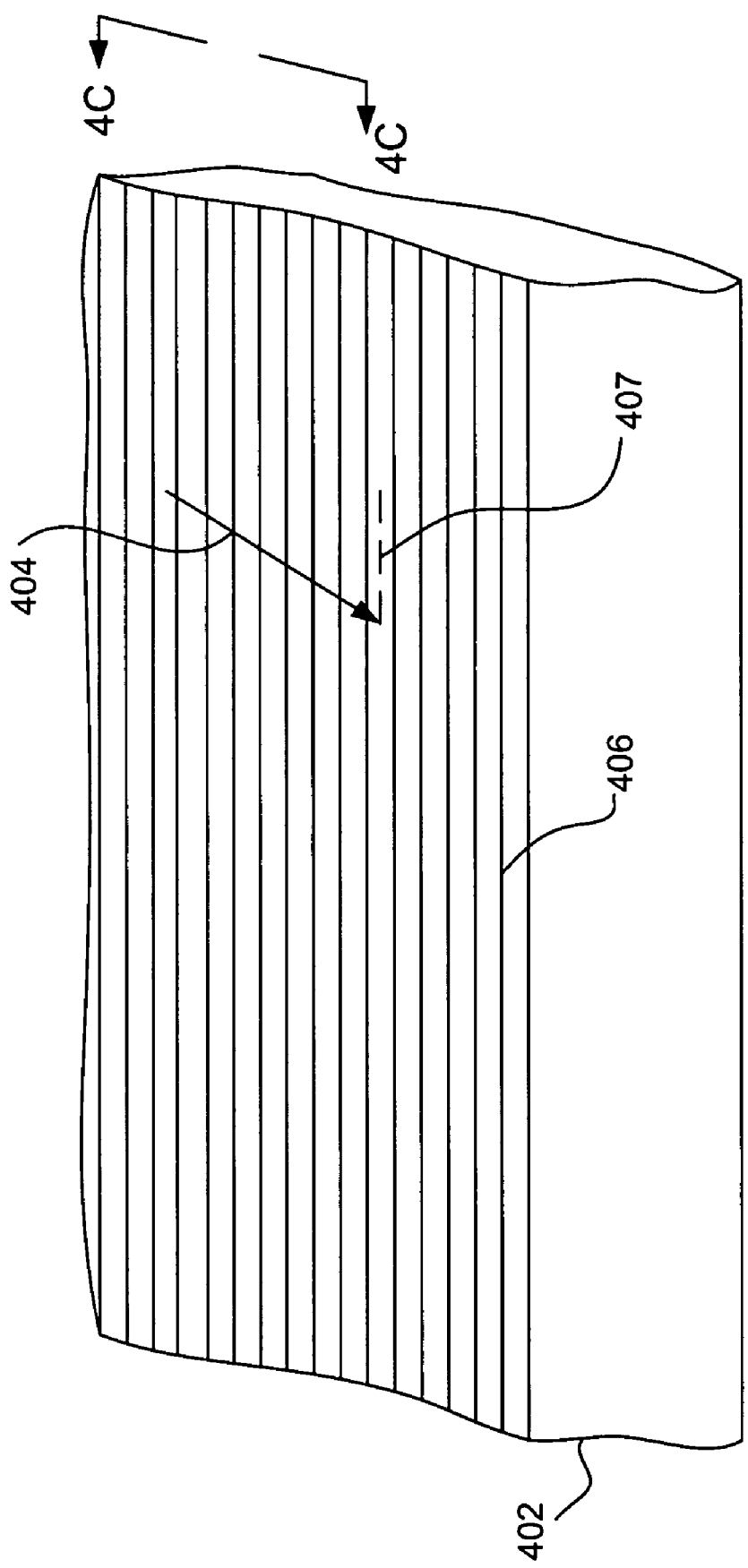
Figure 4C:
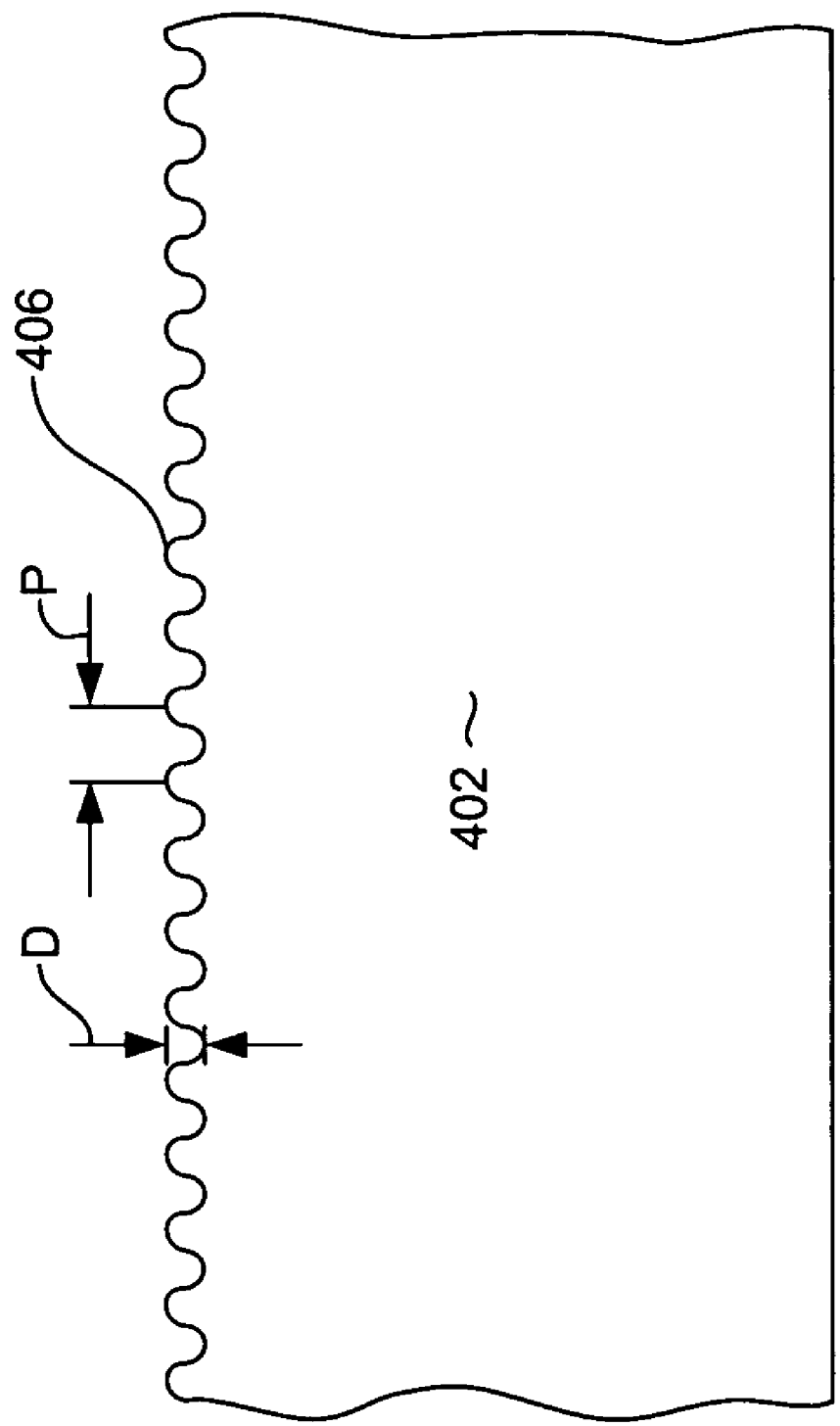
Figure 4D:
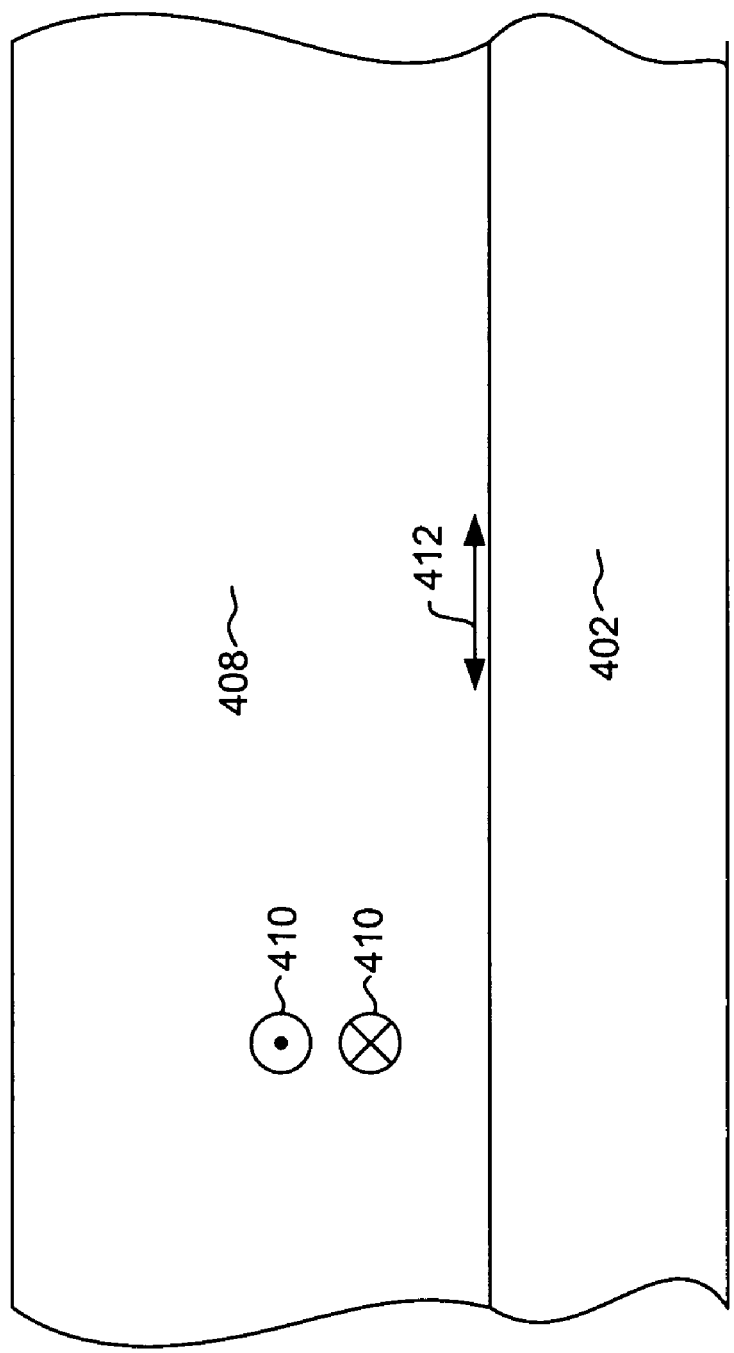

With reference to FIGS. 3A and 3B, the present invention can also be practiced in a CPP sensor, such as a CPP GMR or CPP TMR sensor, having a sensor stack 302 comprising a pinned layer structure 304, and a free layer 306. With reference to FIG. 3A, for a CPP GMR sensor the free and pinned layers 304, 306 are separated by a non-magnetic, electrically conductive spacer layer 312, which may be, for example, Cu. With reference to FIG. 3B, for a CPP TMR sensor the free and pinned layers 304, 306 are separated by a non-magnetic, electrically insulating barrier layer 313, which may be, for example, Al-oxide. A capping layer 314, such as Ta, may also be provided at the top of the sensor stack 302 to protect the sensor layers from damage during manufacture.

With continued reference to FIGS. 3A and 3B, the sensor stack is sandwiched between first and second electrically conductive, magnetic shields 316, 318 which may be constructed of, for example NiFe, and serve as first and second electrical leads for providing a sense current to the sensor stack 302. Hard magnetic bias layers 320, 322 are provided for biasing the magnetic moment 324 of the free layer 306 in a direction substantially parallel with the ABS. First and second insulation layers 326, 328 are provided to prevent current shunting between the shields through the hard bias layers 320, 322.

The free layer 306 may be constructed of one or more layers of for example NiFe, Co, CoFe, or other sufficiently soft magnetic material, preferably with a layer of Co or CoFe adjacent to the spacer layer 312. The pinned layer structure 304 may be a simple, single layer pinned layer, but is more preferably an AP pinned structure having first and second magnetic layers AP1 330, AP2 332 separated from one another by an antiparallel coupling layer (AP coupling layer) 334. The AP1 and AP2 layers 330, 332 can be constructed of, for example, CoFe and the AP coupling layer 334 can be Ru or Ir. The coupling layer 334 can be for example 2-10 Angstroms thick or about 8 Angstroms thick. The AP1 layer 330 is exchange coupled with a layer of antiferromagnetic material (AFM layer 308) which strongly pins the magnetic moment 338 of the AP1 layer 330 in a desired direction perpendicular to the ABS and due to AP coupling of the AP1 and AP2 layers 330 and 332 pins the moment 340 of the AP2 layer 332 in a desired direction perpendicular to the ABS, but antiparallel with the moment 338 of the AP1 layer 330.

With reference still to FIGS. 3A and 3B, the hard magnetic bias layers 320, 322 are constructed of a magnetic material having a high coercivity of 1.5 kOe or higher, preferably $Co_{1-x}Pt_x$ or $Co_{1-x-y}Pt_xCr_y$ (x being between 10 and 35 atomic % and y between 0 and 15 atomic %). Typically the hard magnetic bias layers also comprise a seed layer of Cr or CrX (X=Mo, Ti, V) on which the magnetic $Co_{1-x}Pt_x$ or $Co_{1-x-y}Pt_xCr_y$ material is deposited to achieve crystalline texture and sufficiently high coercivity. The hard bias layers have magnetic moments that are set substantially parallel to the ABS in order to bias the moment 324 of the free layer in a desired direction substantially parallel with the ABS. The hard magnetic bias layers 320, 322 are formed on underlayers 340, 342 which can be for example Pt, Ta, PtMn, Cr, Ru, W, Mo, Cu, their alloys or another suitable, preferably crystalline material. The underlayers 340, 342 have been treated as described with reference to FIGS. 4A-4D in order to create anisotropic roughness on the surface of the underlayers 340, 342 and to induce a magnetic anisotropy axis 350 in the hard magnetic bias layers 320 and 322 in a direction substantially parallel with the ABS. This means that the underlayers 340, 342 have been ion beam etched prior to deposition of the hard magnetic bias layers 320, 322 at an angle and direction that must be chosen such that the resulting magnetic easy axis of the hard magnetic bias layers 320, 322 is substantially parallel to the ABS.

The underlayers 340, 342 (which may have a thickness of 30-300 Angstroms after etching) exhibit anisotropic roughness for example in the form of oriented ripples or facets in their upper interface. Depending on material and etch conditions the ripples or facets may be oriented predominantly in a direction substantially perpendicular or parallel to the ABS.

The strong anisotropy 350 of the bias layers 320, 322 greatly facilitates effective biasing of the free layer 324. As sensors become smaller, effective stable biasing becomes increasingly difficult. The strong anisotropy 350 provided by the present invention, therefore, promotes stable free layer biasing in a very small magnetoresistive sensor.

With reference to FIGS. 4A through 4D, The underlayers 212, 214 (FIG. 2) and 340, 342 (FIG. 3) are constructed by depositing a material 402, which could be for example Pt, Ta, PtMn, Cr, Ru, W, Mo, Cu, their alloys, or some other suitable, preferably crystalline, material. The underlayer material 402 can be for example 30 to 300 Angstroms or about 100 Angstroms thick after ion beam etching. An ion beam etch 404 is then performed at an angle Θ with respect to a normal to the surface of the underlayer 402 and without rotation of the substrate the underlayer is deposited on. The angled ion etch induces anisotropic roughness for example in form of oriented ripples or facets 406. Depending on material and etch conditions the ripples or facets may be oriented predominantly in a direction substantially perpendicular or parallel to the in plane projection 407 of the ion beam onto the surface of the layer 402. The typical or average pitch P of the ripples 406 is between 10-200 nm, their average depth D is between 0.5 to 5 nm or about 1 nm.

After the angled ion etch 404 has been performed sufficiently to form the desired ripples or facets 406, a layer of hard magnetic material 408 (FIG. 4D) is deposited. The hard magnetic material 408 can be for example CoPt or CoPtCr can include multiple layers, such as a seed layer of Cr or CrX (X=Mo, Ti, V) and a layer of CoPt or CoPtCr. The magnetic easy axis 410 of the applied hard magnetic material 406 will be substantially perpendicular to the in plane projection 407 (FIG. 4B) of the angled ion etch onto the surface of the under layer 402. If another suitable hard magnetic material is used instead of CoPt or CoPtCr, the magnetic easy axis may be either substantially parallel or substantially perpendicular to the in-plane projection 407 of the angled ion etch. The ion etch direction must be chosen such that the resulting magnetic easy axis of the hard magnetic bias layers is substantially parallel to the ABS.

The angled ion etch 404 is preferably performed at an angle of between 20 and 80 degrees and is more preferably performed at an angle of between 35 and 65 degrees with respect to the normal to the surface of the underlayer 402. The exact voltage, current, and angle conditions depend on the type and characteristics of the ion source in use.

In one demonstration of the above described treatment method, about 300 Angstroms of Ta were deposited and etched under an angle of about 45 degrees from normal for 1200 seconds at an ion source voltage of 100 Volts and a current of 1 Ampere. The etch rate was about 5-7 Angstroms per minute. The Ta samples were taken out of vacuum and reintroduced into another deposition system. Thus some oxide layer formed on the top of the Ta. Finally a seed layer of about 30 Angstroms of Cr, about 50 Angstroms of $Co_{82}Pt_{18}$ hard magnetic bias material, and about 50 Angstroms of Ru, and about 25 Angstroms of Ta cap material were deposited onto the treated underlayer. Magnetization measurements shown in FIG. 5A demonstrate that a uniaxial anisotropy is introduced by the ion beam etch. The easy axis is perpendicular to the in-plane projection of the ion beam during etching. The structural origin was investigated by X-ray diffraction. The reflectivity rocking curves of an etched Ta substrate taken with the plane of the X-rays and the ion beam parallel and perpendicular to each other exhibit an enhancement of the diffusive background in the direction perpendicular to the ion beam. This is a clear indication of the change in substrate morphology with anisotropic roughness. Underlayers with various crystalline structures including Ta (body centered tetragonal), Cr (body centered cubic), PtMn (body centered tetragonal), Cu (face centered cubic), and Ru (hexagonal closed packed) have been ion beam etched in a fashion similar to what is described above and a Cr(35)/$CoPt_{18}$(50) bilayer with Ta cap was deposited ontop. Magnetic measurements revealed a $CoPt_{18}$ easy axis perpendicular to the ion beam direction showing that the effect is independent of the type of crystalline structure.

In another demonstration of the above described treatment method, about 300 Angstroms of Ru on were deposited and etched under an angle of about 45 degrees from normal for 600 seconds at an ion source voltage of 100 Volts and a current of 1 Ampere. For improved etch uniformity the wafer was rotated 180 degrees in-plane and the Ru layer was etched for another 600 seconds at an ion source voltage of 100 Volts and a current of 1 Ampere. The etch rate was about 5-10 Angstroms per minute. The Ru sample was taken out of vacuum and reintroduced into another deposition system. Thus some oxide layer formed on the top of the Ru. Finally a $NiFe_{14}$ layer of about 30 Angstroms, and about 50 Angstroms of Ru, and about 25 Angstroms of Ta cap material were deposited onto the treated underlayer. Magnetization measurements shown in FIG. 5B demonstrate that a uniaxial anisotropy is introduced by the ion beam etch. The easy axis is perpendicular to the in-plane projection of the ion beam during etching. The anisotropy field $H_K$ is 300 Oe, the easy axis coercivity $H_c$ is about 3.5 Oe. For comparison a $NiFe_{14}$ layer of about 30 Angstroms deposited on an unetched Ru layer did not exhibit any in-plane anisotropy. Its coercivity was about 2 Oe measured along any in-plane direction. This is a clear indication that the underlayer treatment induces a strong uniaxial anisotropy which can be utilized to self-bias the free layer without any other form of biasing such as hard-bias, in-stack bias or biasing with a orthogonal coupling layer.

Figure 6:
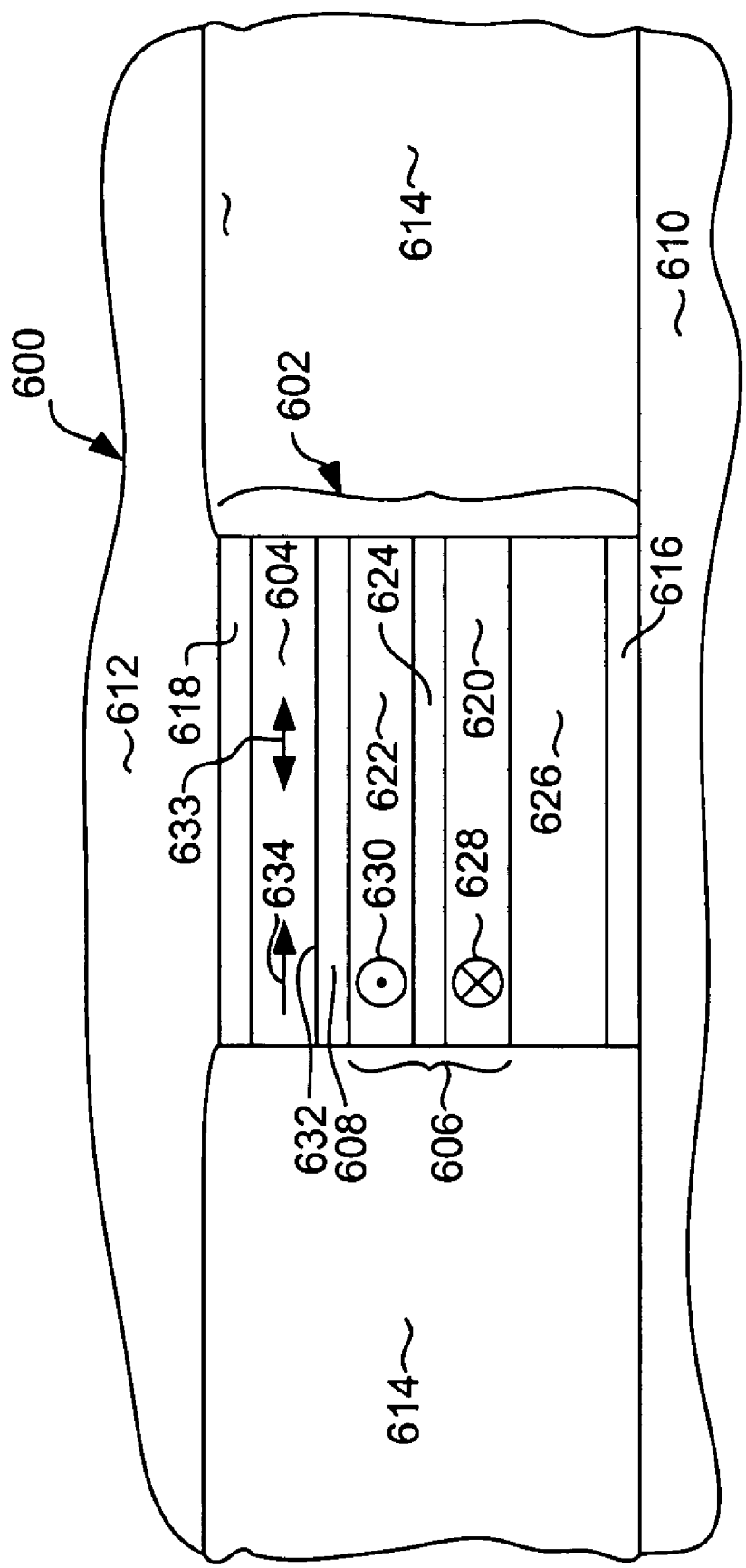
FIGS. 6-13 are ABS views of sensors according various embodiments of the invention.

With reference now to FIG. 6, a CIP magnetoresistive sensor 600 according to an embodiment of the invention includes a sensor stack 602 having a self biased free layer 604, a pinned layer structure 606 and a non-magnetic, electrically conductive spacer layer 608 sandwiched between the free layer and the pinned layer structure. The sensor stack 602 is sandwiched between first and second electrically insulating gap layers 610, 612. First and second electrically conductive lead layers 614 can be formed at either side of the sensor stack 602. Since the free layer 604 is self biased, the usual hard bias layers are not necessary, allowing the entire space between the first and second gaps 610, 612 to be constructed of a high electrical conductivity material such as Rh, Au or Cu. However, hard bias layers may be included at either side of the sensor stack 602 to augment the self-biasing effect as will be described in greater detail below.

The sensor stack 602 may include a seed layer 616, formed at the bottom of the sensor stack 602 to initiate a desired epitaxial growth in the other sensor layers. The sensor stack may also include a capping layer, 618, such as Ta to protect the layers of the sensor stack 602 from damage during manufacture. The free layer 604 may be constructed of one or more layers of for example NiFe, Co, CoFe, or other sufficiently soft magnetic material, preferably with a layer of Co or CoFe adjacent to the spacer layer 608. The spacer layer 608 may be constructed of several materials, and is preferably constructed of Cu.

With continued reference to FIG. 6, the pinned layer structure can be of several designs, such as simple, AP coupled, antiferromagnetically (AFM) pinned or self pinned. For purposes of illustration, the pinned layer structure 606 will be described as an AP coupled, AFM pinned structure. Therefore, the pinned layer structure includes first and second magnetic layers AP1 620 and AP2 622 which may be constructed of CoFe, NiFe or some other magnetic material. The AP1 and AP2 layers 620, 622 are antiparallel coupled across an AP coupling layer 624, which may be for example Ru or Ir. The AP1 layer 620 is exchange coupled with a layer of antiferromagnetic material (AFM layer) 626 such as, for example, PtMn or IrMn. This exchange coupling strongly pins the magnetic moment 628 of the AP1 layer 620 in a desired direction perpendicular to the ABS and the strong antiparallel coupling of AP1 620 and AP2 622 strongly pins the moment 630 of the AP2 layer 622 in a direction opposite to the moment 628 of AP1 620.

With continued reference to FIG. 6, the spacer layer 608 has a surface 632 adjacent to the free layer 604 that has been treated by the process described with reference to FIGS. 4A through 4D to provide the surface 632 with a desired texture. This texture includes an anisotropic roughness that induces a strong magnetic anisotropy in the free layer 604 in a direction parallel with the ABS. The resulting magnetic anisotropy in the free layer 604 allows the free layer 604 to have a magnetic moment 634 that is biased in a direction parallel with the ABS as shown, without the need for an external bias mechanism such as in stack biasing, hard biasing, or biasing with a orthogonal coupling layer.

Figure 5B:
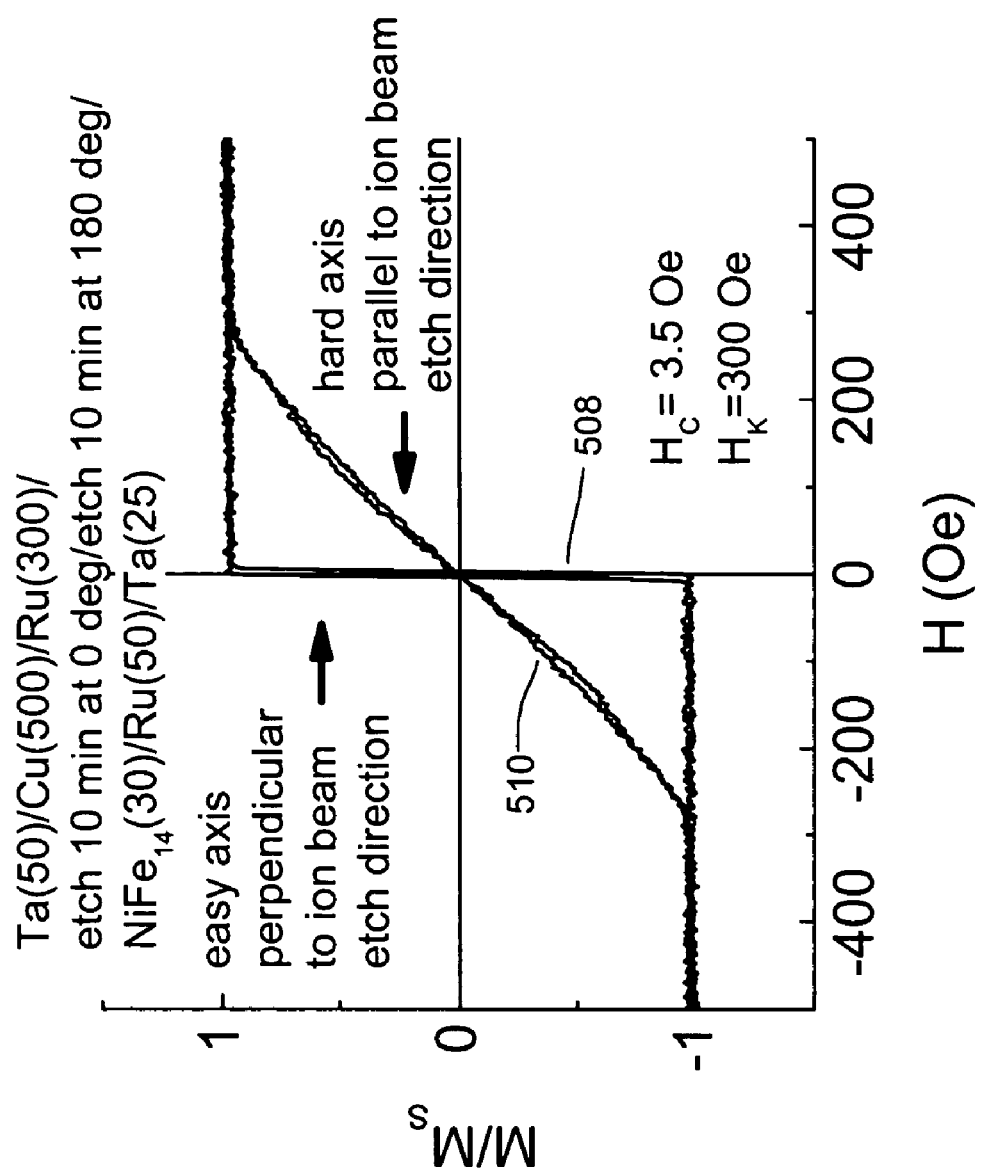
FIG. 5B. is a graph illustrating magnetic hysteresis loops of a NiFe$_{14}$(30) film grown onto a Ru underlayer which was etched 600 seconds under an oblique angle of ~45 degrees from normal without rotating the substrate, rotating the substrate 180 degrees in plane, then etching an additional 600 seconds under an oblique angle of ~45 degrees from normal for improved etch uniformity. The hysteresis loops are measured perpendicular and parallel to the ion-beam direction.

FIG. 5B shows magnetic hysteresis loops of a free layer 604 formed on a spacer layer 608 treated as described above. The line 508 show the hysteresis loop in response to a magnetic field parallel with the easy axis of the free layer 604. The line 510 shows the hysteresis loop in response to a magnetic field that is perpendicular to the easy axis of the free layer 604. The strong anisotropy 633 of the free layer 604 facilitates the self effective biasing effect of the free layer 604.

Although the free layer 604 can remain biased without the use of such external biasing mechanisms, these biasing mechanisms can be used as well to augment the self-biasing effect as will be described below with reference to various alternate embodiments.

The treatment of the surface 632 of the spacer layer 608 preferably causes an anisotropic roughness in the form of ripples or facets. This mechanism for providing a magnetic anisotropy (easy axis) in the free layer 604 can be understood upon reviewing the discussion of FIGS. 4A through 4D.

Figure 11:
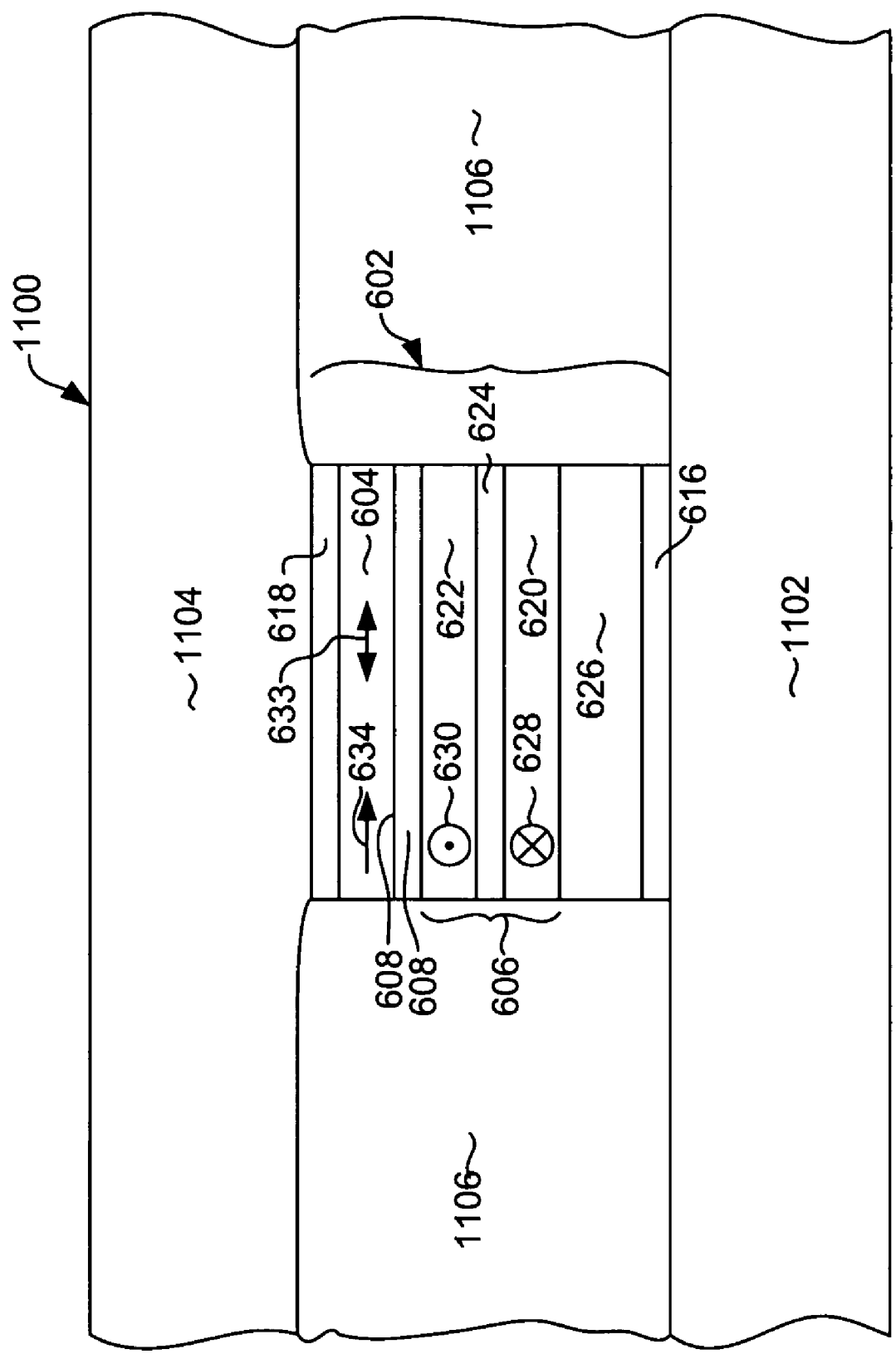

The sensor 600 described with reference to FIG. 6 has been described as a current in plane sensor. The invention could, however be embodied in a current perpendicular to plane (CPP) GMR or tunnel valve sensor. FIG. 11 shows a CPP sensor 1100 having a structure similar to that described above with respect to FIG. 6. The CPP sensor 1100 includes first and second electrically conductive leads 1102, 1104, which can be constructed of a magnetic material such as NiFe so that they may function as magnetic shields as well as electric leads. In this embodiment, sense current flows from the first lead 1102 to the second lead 1104 in a direction perpendicular to the layers of the sensor 1100. The electrically conductive layers 614 of FIG. 6 have been replaced with non-magnetic, electrically insulating material 1106 such as alumina to prevent shunting of current between the leads 1102, 1104. If the CPP sensor is a tunnel valve structure the spacer layer 608 is replaced with a thin, electrically insulating barrier layer such as aluminum oxide.

Figure 7:
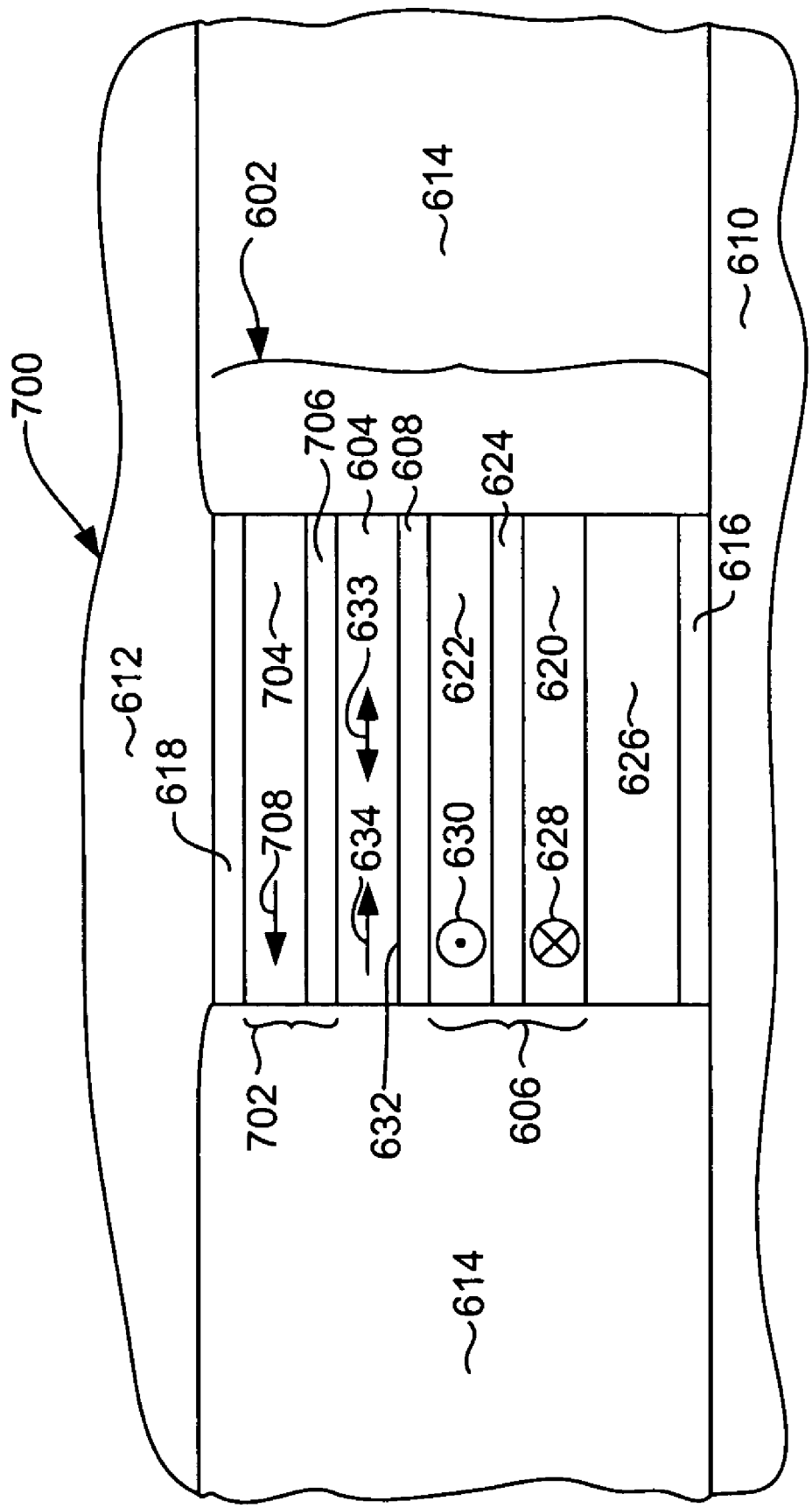

With reference now to FIG. 7, an alternate embodiment of the invention includes magnetoresitive sensor 700 having an in stack bias structure 702 formed adjacent to the free layer 604. The in stack bias structure may include a hard magnetic layer 704, and a non-magnetic coupling layer 706 sandwiched between the hard magnetic layer 704 and the free layer 604. The hard magnetic layer can be constructed of many hard magnetic materials, such as CoPtCr, and is antiparallel coupled with the free layer 604 across the coupling layer 706, which may be constructed of Ru. The hard magnetic layer 704 has a magnetic moment 708 that is oriented in a direction substantially parallel with the ABS and substantially antiparallel to the moment 634 of the free layer. Alternatively, layer 704 can be a magnetic bias layer such as CoFe exchange biased with an antiferromagnet such as IrMn or PtMn. Alternatively, coupling layer 706 could be an orthogonal coupling layer such as a thin PtMn or IrMn layer (thin meaning having a thickness well below the thickness at which it exhibits its antiferromagnetic exchange bias effect) and layer 704 a magnetic bias layer such as CoFe exchange biased with an antiferromagnet such as IrMn or PtMn. In this case the magnetic moment 634 of the free layer 604 would be coupled substantially perpendicular to the magnetic moment 708 of layer 704 free layer.

With continued reference to FIG. 7, the spacer layer 608 has a surface 632 that has been treated as described above with reference to FIG. 6 and FIGS. 4A through 4D to generate a magnetic anisotropy 633 in the free layer 604. This magnetic anisotropy strongly assists biasing, so that the biasing provided by the in stack bias structure 702 can be much weaker than would be allowable without the magnetic anisotropy 633. This means that the magnetic layer 704 can be made much thinner than would be possible without the magnetic anisotropy 633. This also means that a larger range of materials are available for use in the magnetic layer 704 and coupling layer 706.

Figure 8:
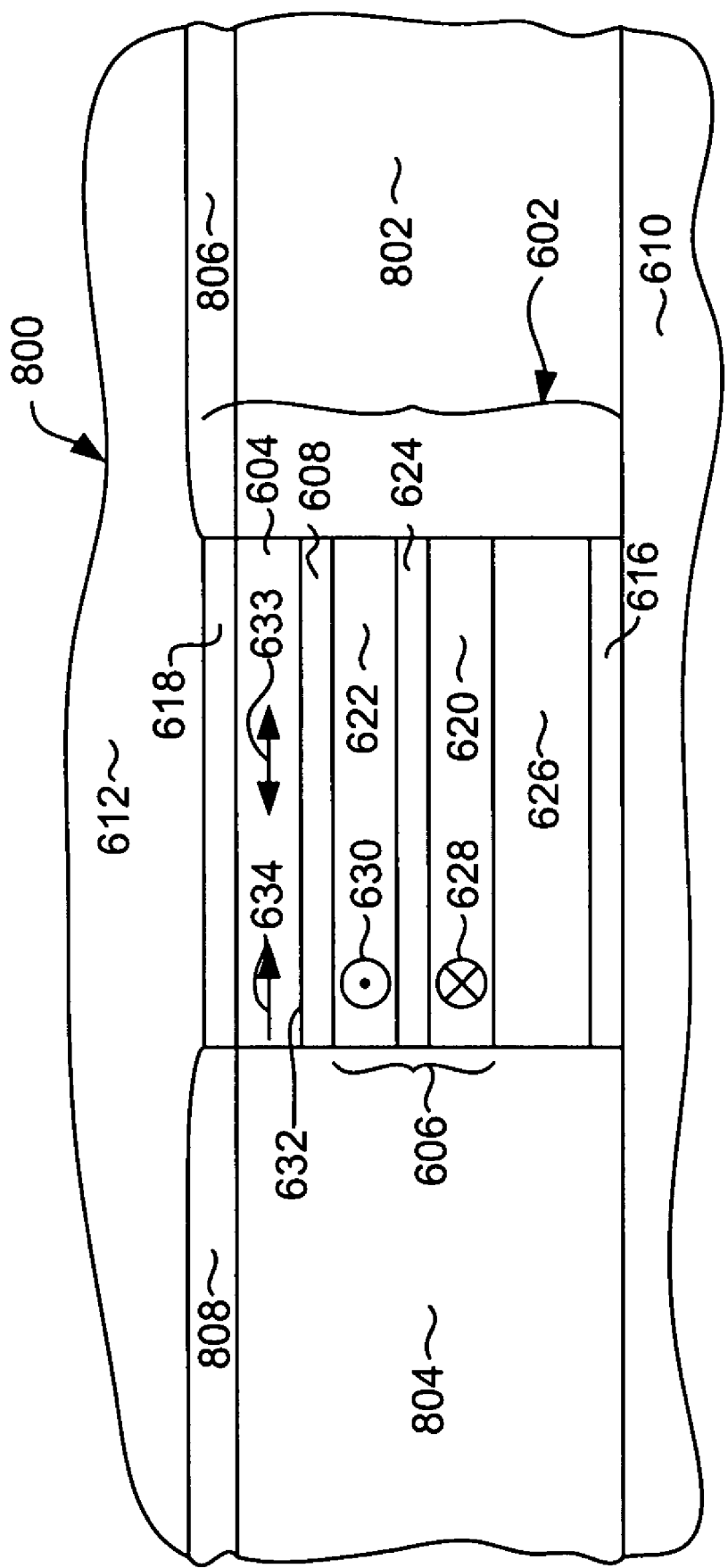

With reference now to FIG. 8, a magnetoresistive sensor 800 according to yet another embodiment of the invention includes first and second hard magnetic layers formed at either side of the sensor stack. The hard bias layers 802, 804 can be constructed of CoPtCr or some other high coercivity magnetic material. First and second electrically conductive lead layers 806, 808 may be provided above the hard bias layers 802, 804 to provide improved flow of sense current to the sensor stack 602. The leads 806, 808 may be constructed of, for example Rh, Au, Cu or some other electrically conductive material. As with the embodiments described with reference to FIGS. 6 and 7, the free layer 604 is constructed upon a spacer layer 608 that has a surface 632 that has been treated as described with reference to FIGS. 4A-4D to induce a magnetic anisotropy 633 in the free layer. Because the free layer 604 has a magnetic anisotropy 633 parallel with the ABS, the biasing provided by the hard bias layers 802, 804 need not be as strong as would otherwise be the case. In addition, as sensor become ever smaller, free layer biasing becomes more unstable. This instability reaches a point where traditional hard bias layers alone cannot provide sufficient biasing to maintain stable free layer biasing. The addition of the magnetic anisotropy 633 in the free layer 604, in conjunction with the biasing provided by the hard bias layers 802, 804 ensures that sufficient free layer stability can be maintained even in a very small sensor.

Figure 9:
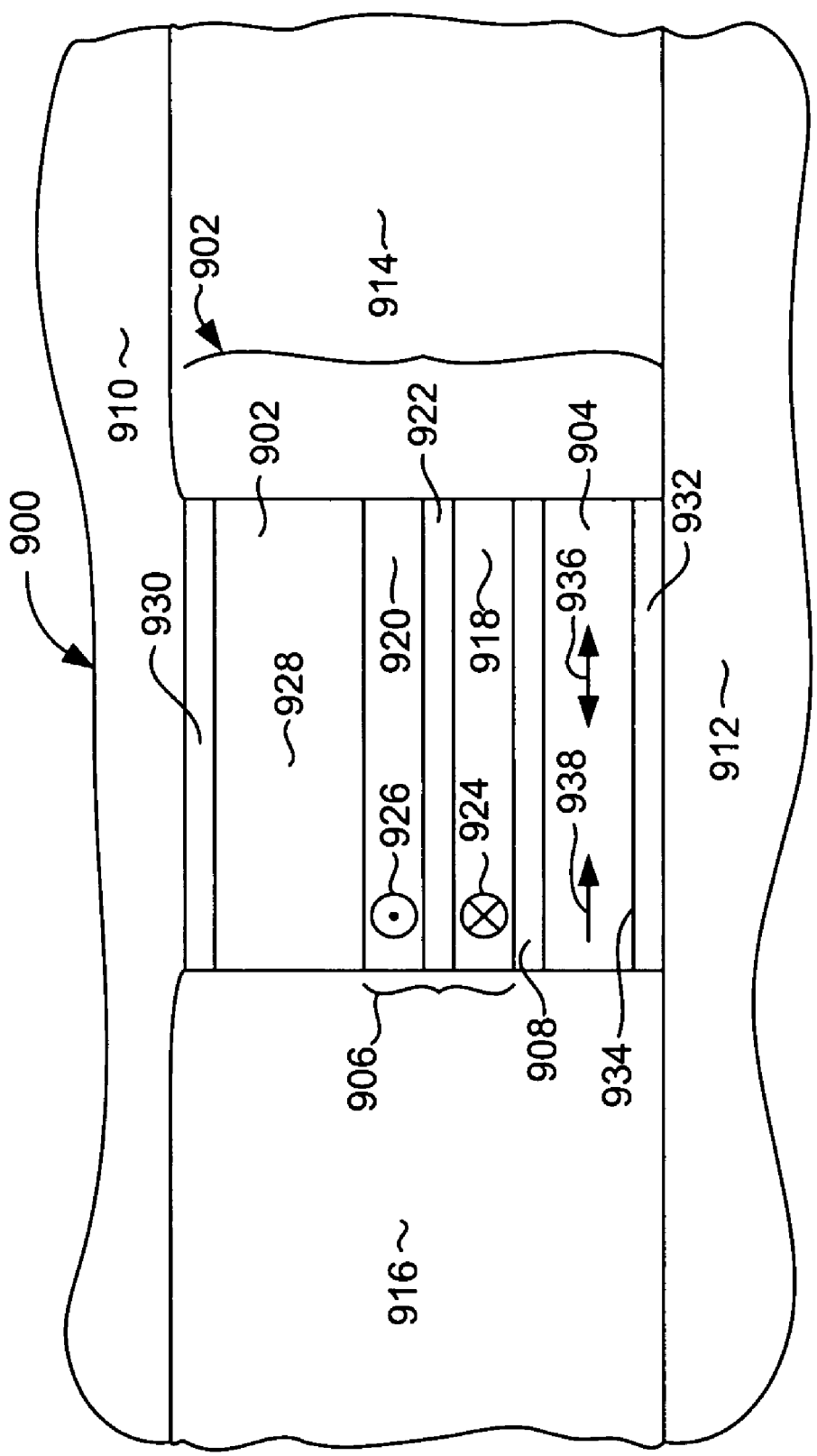

With reference now to FIG. 9, a CIP magnetoresistive sensor 900 according to yet another embodiment of the invention includes a sensor stack 902 having a free layer 904 formed beneath a pinned layer structure 906. A spacer layer 908 is sandwiched between the free layer 904 and pinned layer structure 906. The sensor stack is sandwiched between first and second electrically insulating gap layers 910, 912. First and second electrically conductive lead layers 914, 916 fill the space between the gap layers 910, 912. The gap layers 910, 912 can be constructed of, for example aluminum oxide, and the leads 914, 916 can be constructed of, for example Rh, Au, Cu or some other electrically conductive material.

With continued reference to FIG. 9, the pinned layer includes AP1 and AP2 layers 920, 918 that are antiparallel coupled across an AP coupling layer 922, which may be for example Ru or Ir. The AP1 layer 920 is exchange coupled with a layer of antiferromagnetic material (AFM layer) 928 such as, for example, PtMn or IrMn. This exchange coupling strongly pins the magnetic moment 926 of the AP1 layer 920 in a desired direction perpendicular to the ABS and the strong antiparallel coupling of AP1 920 and AP2 918 strongly pins the moment 924 of the AP2 layer 918 in a direction opposite to the moment 926 of AP1 920.

A capping layer 930 may be provided at the top of the sensor stack 902 to protect the sensor layers from damage during manufacture.

The free layer 904 if constructed upon an underlayer 932. The underlayer 932 can be constructed of Pt, Ta, PtMn, Cr, Ru, W, Mo, Cu, NiFeCr, or their alloys or some other preferably crystalline material. The underlayer 932 has a surface 934 that has been treated by an etching process as described with reference to FIGS. 4A through 4D to create an anisotropic roughness. The anisotropic roughness may be in the form of ripples or facets. The underlayer 932 can be for example 50 to 300 Angstroms or about 100 Angstroms thick after etching.

The free layer 904 has a magnetic anisotropy 936 oriented substantially parallel with the ABS. The magnetic anisotropy 936 is induced by the treated underlayer as described above with reference to the previously described embodiments, and as described with reference to FIGS. 4A-4D. The anisotropy 936 allows the free layer 904 to have a self biased magnetic moment 938 that is biased in a desired direction substantially parallel with the ABS without the need for other biasing mechanisms such as hard bias layers or an in stack bias layer.

It should be pointed out that the above described sensor 900 having a free layer formed near the bottom of the sensor and formed on an underlayer 932 can be constructed with additional biasing structures such as in stack biasing, hard biasing, or biasing with an orthogonal coupling layer. Such bias structures would provide additional biasing which would augment the biasing provided by the magnetic anisotropy 936 provided by the ion etch treated underlayer 932. It should also be pointed out that, while the invention has been described above in terms of a current in plane (CIP) GMR sensor, the self biasing structures described could also be embodied in a current perpendicular to plane (CPP) GMR sensor or a tunnel valve as described below.

Figure 12:
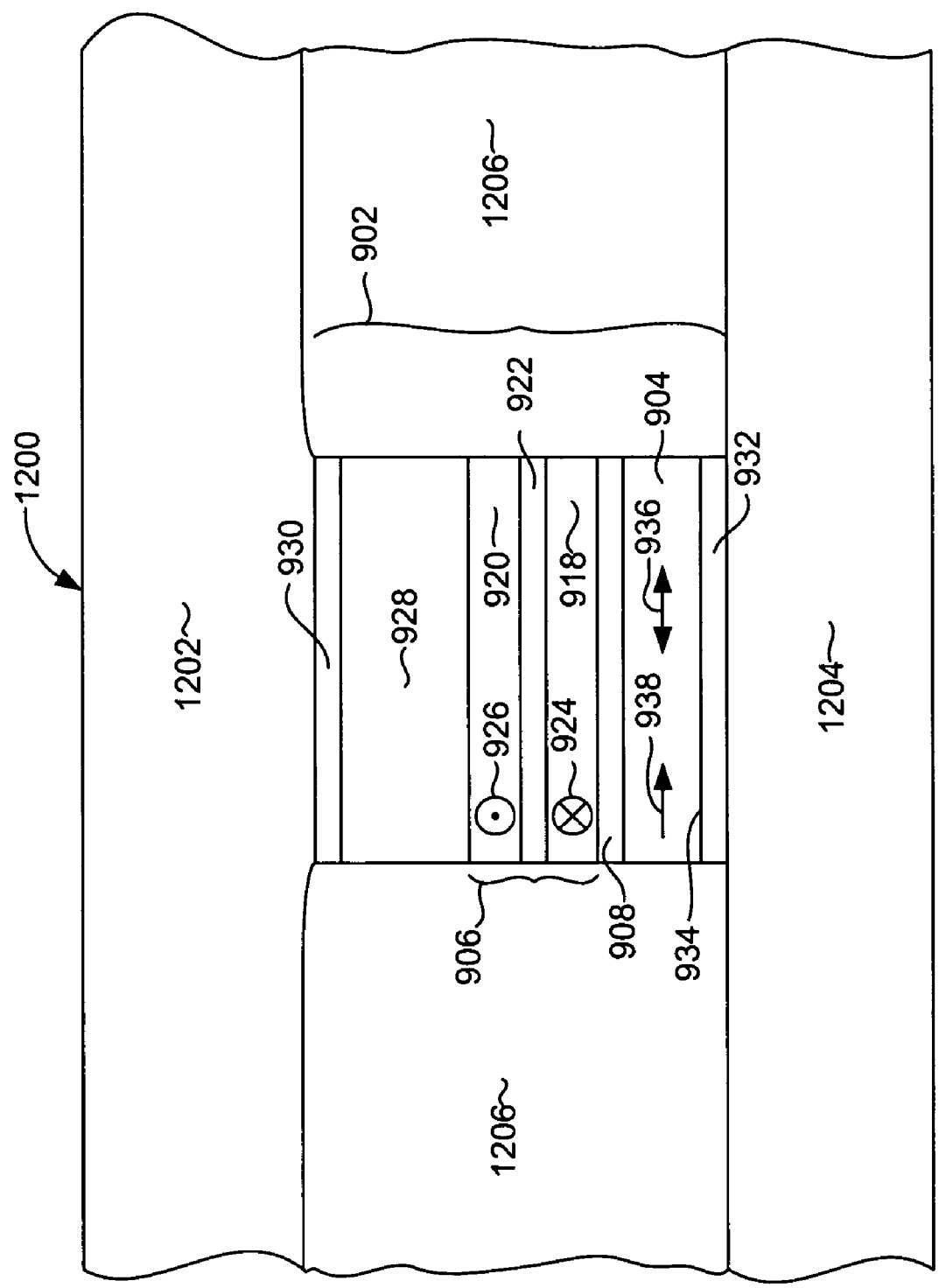

The sensor 900 described with reference to FIG. 9 has been described as a current in plane sensor. The invention could, however be embodied in a current perpendicular to plane (CPP) sensor. FIG. 12 shows a CPP sensor 1200 having a structure similar to that described above with respect to FIG. 9. The CPP sensor 1200 includes first and second electrically conductive leads 1202, 1204, which can be constructed of a magnetic material such as NiFe so that they may function as magnetic shields as well as electric leads. In this embodiment, sense current flows from the first lead 1202 to the second lead 1204 in a direction perpendicular to the layers of the sensor 1200. The electrically conductive layers 914, 916 of FIG. 9 have been replaced with non-magnetic, electrically insulating material 1206 such as alumina to prevent shunting of current between the leads 1202, 1204. If the CPP sensor is a tunnel valve structure the spacer layer 908 is replaced with a thin, electrically insulating barrier layer such as aluminum oxide.

Figure 10:
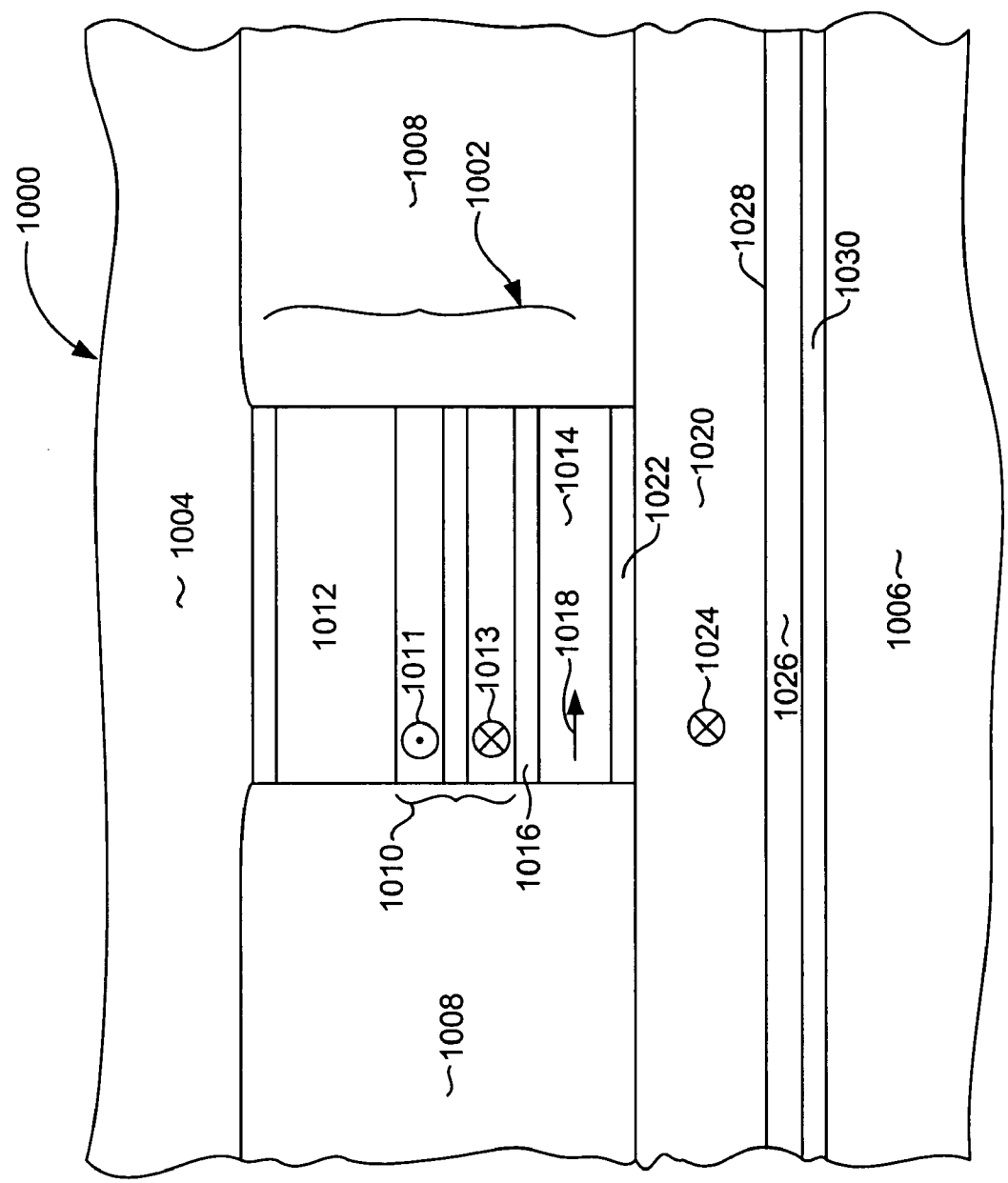

With reference now to FIG. 10, a magnetoresistive sensor 1000 according to still another embodiment of the invention includes a sensor stack 1002 sandwiched between first and second electrically conductive leads 1004, 1006, which may be constructed of a magnetic material to serve as magnetic shields as well as leads. Insulation material 1008, such as alumina, outside of the sensor stack 1002 prevents current from being shunted between the leads 1004, 1006. The sensor stack includes a pinned layer structure 1010 having pinned magnetic moments 1011, 1013. The pinned layer structure 1010 can be exchange coupled to an AFM layer 1012. The sensor stack 1002 also includes a magnetic free layer 1014, and a non-magnetic, electrically conductive spacer layer 1016 sandwiched between the pinned layer structure 1010 and the free layer 1014. It should be pointed out that, while the sensor 1000 is being described as a CPP GMR sensor, it could also be embodied in a tunnel valve sensor, in which case, the layer 1016 would be a thin, non-magnetic, electrically insulating barrier layer such as alumina. A capping layer, such as Ta may be provided at the top of the sensor stack 1002 to prevent damage to the sensor layers during manufacture.

With continued reference to FIG. 10, the free layer 1014 has a magnetic moment 1018 that is biased by orthogonal coupling with a biasing layer 1020 across an orthogonal coupling layer 1022. The biasing layer is preferably a magnetic material such as CoFe, NiFe, CoPt, CoPtCr or some other magnetic material. The coupling layer 1020 has a magnetic moment 1024 that is pinned in a direction perpendicular to the ABS as shown. Pinning is achieved by a strong magnetic anisotropy (easy axis perpendicular to the ABS) which is provided by an underlayer 1026. The underlayer 1026 can be constructed of Pt, Ta, PtMn, Cr, Ru, W, Mo, Cu, NiFeCr, or their alloys or some other preferably crystalline material, and has a surface 1028 that has been treated according to the process described with reference to FIGS. 4A through 4D to create an anisotropic roughness in the surface 1028. An optional seed layer 1030 may be provided beneath the underlayer 1026 if desired to promote a desired epitaxial growth in the above layers.

The orthogonal coupling of the free layer 1014 to the biasing layer 1020 is induced by the electrically-conducting spacer layer (orthogonal coupling layer) 1022. The coupling layer 1022 is preferably a generally equiatomic $Pt_{50}Mn_{50}$ layer having a thickness less than approximately 100 Angstroms, preferably between approximately 15 and 50 Angstroms. This thickness is well below the thickness at which $Pt_{50}Mn_{50}$ exhibits its antiferromagnetic exchange bias effect, which is typically at a thickness greater than approximately 100 Angstroms.

Orthogonal magnetic coupling has been observed between two $Co_{90}Fe_{10}$ layers, in which the first $Co_{90}Fe_{10}$ layer is exchange-biased to a PtMn antiferromagnetic layer and the two $Co_{90}Fe_{10}$ layers are separated by a thin cobalt-ferrite ($CoFe_2O_4$) layer. S. Maat and B. Gurney, "90 Degree Coupling Induced by Exchange Biasing in $PtMn/CoFe_{10}$/$CoFe_2O_4/CoFe_{10}$ Films", J. Appl. Phys., Vol. 93, pp. 7229-7231(2003). However, because cobalt-ferrite is an electrical insulator, structures incorporating it are generally not usable in CPP sensors. This orthogonal coupling mechanism is described in Patent Application entitled CURRENT-PER-PENDICULAR-TO-PLANE MAGNETORESISTIVE SENSOR WITH FREE LAYER STABILIZED BY IN-STACK ORTHOGONAL MAGNETIC COUPLING, docket number HSJ9-2004-0056US1, filed Mar. 16, 2004 which is incorporated herein by reference in its entirety.

Figure 13:
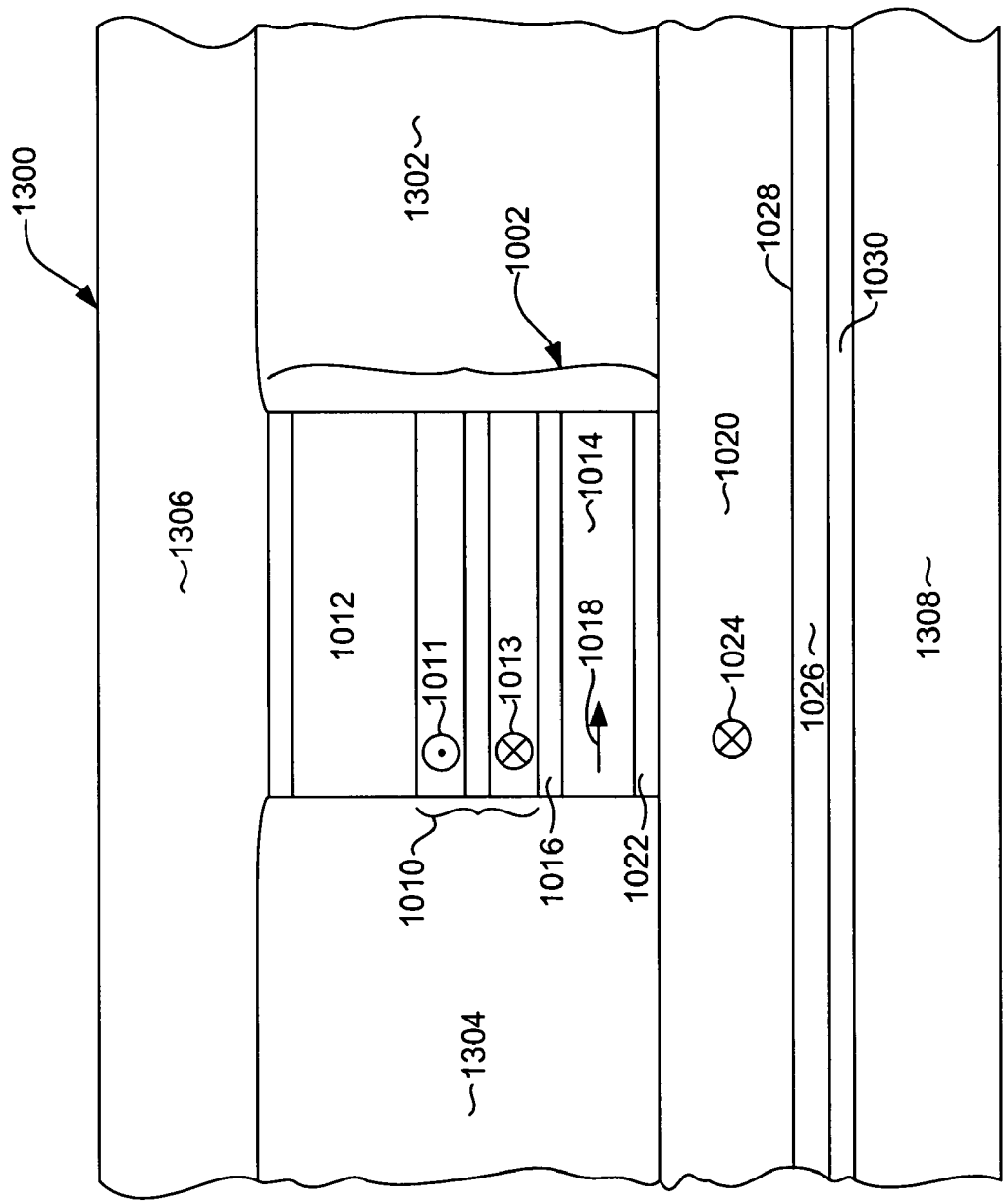

The sensor 1000 described with reference to FIG. 10 has been described as a current perpendicular to the plane (CPP) sensor. The invention could, however be embodied in a current in plane (CIP) sensor. FIG. 13 shows a CIP sensor 1300 having a structure similar to that described above with respect to FIG. 10. The CIP sensor 1300 includes first and second electrically conductive leads 1302, 1304. In this embodiment, sense current flows from the first lead 1302 to the second lead 1304 in a direction substantially parallel to the layers of the sensor 1300. The top and bottom leads of FIG. 10 have been replaced with first and second non-magnetic, electrically insulating gap layers 1306, 1308. To minimize shunting the orthogonal coupling layer 1022 may comprise an insulating material like $CoFe_2O_4$.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
a magnetic free layer;
a magnetic pinned layer structure; and
a non-magnetic spacer layer sandwiched between the free layer and the pinned layer structure, the spacer layer having a surface adjacent to the free layer that has an anisotropic roughness configured to induce a magnetic anisotropy in the free layer wherein the sensor has an air bearing surface and wherein the anisotropic roughness comprises ripples or facets that extend along a direction substantially perpendicular to the ABS.

2. A magnetoresistive sensor, comprising:
a magnetic free layer;
a magnetic pinned layer structure; and
a non-magnetic spacer layer sandwiched between the free layer and the pinned layer structure, the spacer layer having a surface adjacent to the free layer that has an anisotropic roughness configured to induce a magnetic anisotropy in the free layer wherein the sensor has an air bearing surface and wherein the anisotropic roughness comprises ripples or facets that extend along a direction substantially parallel to the ABS.

3. A magnetoresistive sensor, comprising:
a magnetic free layer;
a magnetic pinned layer structure; and
a non-magnetic spacer layer sandwiched between the free layer and the pinned layer structure, the spacer layer having a surface adjacent to the free layer that has an anisotropic roughness configured to induce a magnetic anisotropy in the free layer.

4. A sensor as in claim 3, wherein the sensor has an air bearing surface and wherein the magnetic anisotropy in the free layer is oriented substantially parallel to the ABS.

5. A sensor as in claim 3 wherein the anisotropic roughness comprises ripples or facets.

6. A sensor as in claim 3 wherein the spacer layer comprises a material having a crystalline structure.

7. A magnetoresistive sensor as in claim 3 wherein the surface of the spacer layer exhibits anisotropic roughness in the form of ripples having an average pitch of 10-200 nm.

8. A magnetoresistive sensor as in claim 3 wherein the surface of the spacer layer exhibits anisotropic roughness in the form of ripples having an average depth of 0.5-5 nm.

9. A magnetoresistive sensor as in claim 3 wherein the spacer layer comprises an electrically conductive material and the sensor is a giant magnetoresistive CIP-GMR sensor.

10. A magnetoresistive sensor as in claim 3 wherein the spacer layer comprises an electrically conductive material and the sensor is a giant magnetoresistive CPP-GMR sensor.

11. A magnetoresistive sensor as in claim 3 wherein the spacer layer comprises a thin electrically insulating material and the sensor is a tunnel valve.

12. A magnetoresistive sensor as in claim 3 further comprising first and second hard magnetic bias layers disposed adjacent to first and second laterally opposed edges of the free layer.

13. A magnetoresistive sensor as in claim 3 further comprising an in stack bias layer structure formed adjacent to the free layer opposite the spacer layer.

14. A magnetoresistive sensor, comprising:
a magnetic free layer;
a magnetic pinned layer structure;
a non-magnetic spacer sandwiched between the free layer and the pinned layer structure;
an underlayer formed adjacent to the free layer opposite the spacer layer, the underlayer having a surface having an anisotropic roughness, the surface being disposed adjacent to the free layer and inducing magnetic anisotropy in the free layer.

15. A sensor as in claim 14 wherein the sensor has an air bearing surface and wherein the magnetic anisotropy in the free layer is oriented substantially parallel with the ABS.

16. A sensor as in claim 14 wherein the anisotropic roughness comprises ripples or facets.

17. A sensor as in claim 14 wherein the sensor has an air bearing surface (ABS) and wherein the anistropic roughness comprises ripples or facets that run along a direction that is substantially perpendicular to the ABS.

18. A sensor as in claim 14 wherein the sensor has an air bearing surface (ABS) and wherein the anistropic roughness comprises ripples or facets that run along a direction that is substantially parallel to the ABS.

19. A magnetoresitive sensor as in claim 14 wherein the underlayer comprises a material having a crystalline structure.

20. A magnetoresistive sensor as in claim 14 wherein the underlayer comprises a material having a body centered cubic or body centered tetragonal crystal structure.

21. A magnetoresistive sensor as in claim 14 wherein the underlayer comprises a material having a face centered cubic or face centered tetragonal crystal structure.

22. A magnetoresistive sensor as in claim 14 wherein the underlayer comprises a material having a hexagonally closed packed crystal structure.

23. A magnetoresistive sensor as in claim 14 wherein the underlayer comprises Pt, Ta, PtMn, Cr, Ru, W, Mo, Cu, NiFeCr, or their alloys.

24. A magnetoresistive sensor as in claim 14 wherein the surface of the underlayer is oxidized or exposed to atmospheric conditions prior to the deposition of the magnetic free layer.

25. A magnetoresistive sensor as in claim 14 wherein the upper surface of the underlayer exhibits anisotropic roughness in the form of ripples having an average pitch of 10-200 nm.

26. A magnetoresistive sensor as in claim 14 wherein the upper surface of the underlayer exhibits an anisotropic roughness in the form of ripples having an average depth of 0.5-5 nm.

27. A magnetoresistive sensor as in claim 14 wherein the underlayer has a thickness of 30-300 Angstroms.

28. A magnetoresistive sensor as in claim 14 further comprising a seed layer disposed adjacent to the underlayer opposite the free layer, the seed layer comprising a material selected from the group consisting of Ta, Cr, Ru, W, Mo, Cu, NiFeCr, or their alloys.

29. A magnetoresistive sensor as in claim 14 wherein the spacer layer comprises an electrically conductive material and the sensor is a giant magnetoresistive CIP-GMR sensor.

30. A magnetoresistive sensor as in claim 14 wherein the spacer layer comprises an electrically conductive material and the sensor is a giant magnetoresistive CPP-GMR sensor.

31. A magnetoresistive sensor as in claim 14 wherein the spacer layer comprises a thin electrically insulating material and the sensor is a tunnel valve.

32. A magnetoresistive sensor as in claim 14 further comprising first and second hard magnetic bias layers disposed adjacent to first and second laterally opposed edges of the free layer.

33. A magnetoresistive sensor, comprising:
a magnetic free layer;
a magnetic pinned layer structure;
a non-magnetic spacer layer sandwiched between the free layer and the pinned layer structure;
a magnetic bias layer;
an orthogonal coupling layer sandwiched between the magnetic bias layer and the free layer; and
an underlayer formed adjacent to the bias layer opposite the orthogonal coupling layer, the underlayer having a surface formed with an anisotropic roughness configured to induce a magnetic anisotropy in the bias layer.

34. A sensor as in claim 33 wherein the underlayer comprises a material having a crystalline structure.

35. A sensor as in claim 33 wherein the underlayer comprises a material having a body centered cubic, body centered tetragonal, face centered cubic or face centered tetragonal crystal structure.

36. A sensor as in claim 33 wherein the underlayer comprises a material selected from the group consisting of Pt, Ta, PtMn, Cr, Ru, W, Mo, Cu, or their alloys.

37. A sensor as in claim 33 wherein the surface of the underlayer has an anisotropic roughness in the form of ripples having an average pitch of 10-200 nm.

38. A sensor as in claim 33 wherein the surface of the underlayer has an anisotropic roughness in the form of ripples having an average depth of 0.5-5 nm.

39. A magnetoresistive sensor as in claim 33 wherein the spacer layer comprises an electrically conductive material and the sensor is a giant magnetoresistive CIP-GMR sensor.

40. A magnetoresistive sensor as in claim 33 wherein the spacer layer comprises an electrically conductive material and the sensor is a giant magnetoresistive CPP-GMR sensor.

41. A magnetoresistive sensor as in claim 33 wherein the spacer layer comprises a thin electrically insulating material and the sensor is a tunnel valve.

* * * * *